United States Patent
Hayasaki et al.

(10) Patent No.: US 6,191,397 B1
(45) Date of Patent: Feb. 20, 2001

(54) HEATING DEVICE, METHOD FOR EVALUATING HEATING DEVICE AND PATTERN FORMING METHOD

(75) Inventors: Kei Hayasaki; Shinichi Ito; Kenji Kawano, all of Yokohama (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/345,749

(22) Filed: Jul. 1, 1999

(30) Foreign Application Priority Data

Jul. 2, 1998 (JP) .................................................. 10-187626
Mar. 25, 1999 (JP) .................................................. 11-081635

(51) Int. Cl.⁷ ................................................. H01L 21/205
(52) U.S. Cl. ........................ 219/497; 219/405; 118/725; 430/330
(58) Field of Search .................. 219/497, 405, 219/411, 390; 392/416, 418; 118/724–725, 728, 730, 50.1; 430/330, 311, 30

(56) References Cited

U.S. PATENT DOCUMENTS 5,393,624 * 2/1995 Ushijima ................................ 430/30

FOREIGN PATENT DOCUMENTS

| 57-63826 | * | 4/1982 | (JP) . |
| 62-62513 | * | 3/1987 | (JP) . |
| 62-132318 | * | 6/1987 | (JP) . |
| 63-232429 | * | 9/1988 | (JP) . |
| 2-171605 | * | 7/1990 | (JP) . |
| 6-314714 | * | 11/1994 | (JP) . |
| 6-333809 | * | 12/1994 | (JP) . |
| 10-275755 | | 10/1998 | (JP) . |
| 10-300428 | | 11/1998 | (JP) . |
| 11-8180 | | 1/1999 | (JP) . |
| 11-104960 | * | 4/1999 | (JP) . |

* cited by examiner

Primary Examiner—John A. Jeffery
(74) Attorney, Agent, or Firm—Finnegan, Henderson, Farabow, Garrett & Dunner, L.L.P.

(57) ABSTRACT

A heating apparatus for performing heat treatment on a wafer applied with a resist before or after exposure includes a heating plate for heating a wafer which is placed on the heating plate, a light intensity detecting apparatus for irradiating light on the wafer to detect intensity of reflected light from the resist on the wafer, and a control section for controlling heating performed by the heating plate on the basis of the detected intensity of reflected light so that heating amount applied to a plurality of wafers becomes constant. Accordingly, the heating amount of the wafer can be controlled to be constant and variations in dimension of resist patterns can be reduced.

9 Claims, 16 Drawing Sheets

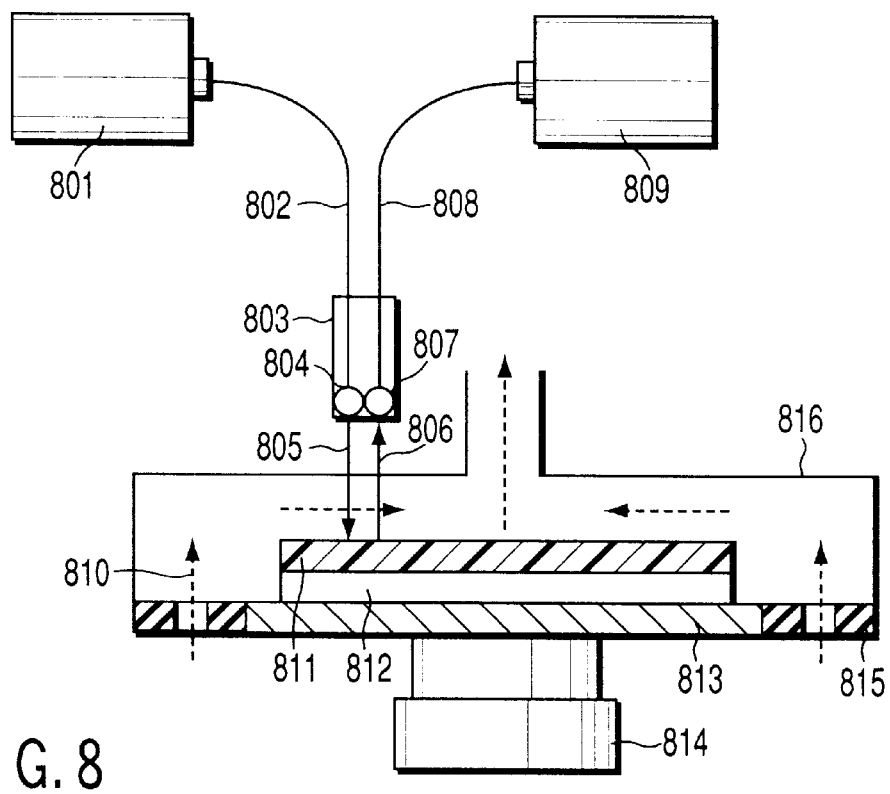
F I G. 8
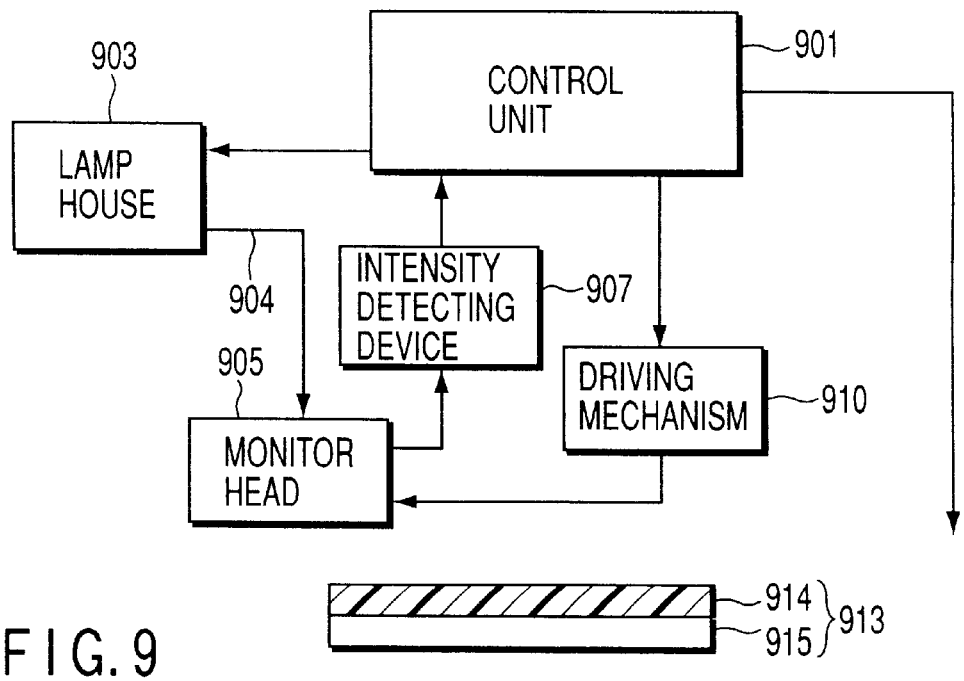
F I G. 9

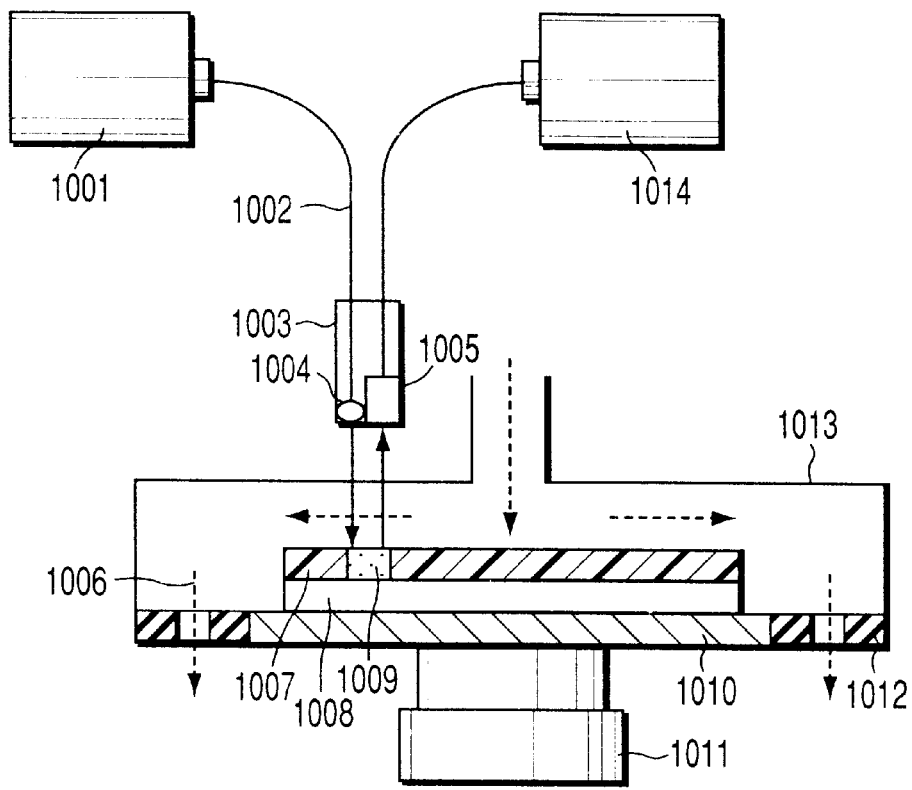
F I G. 10
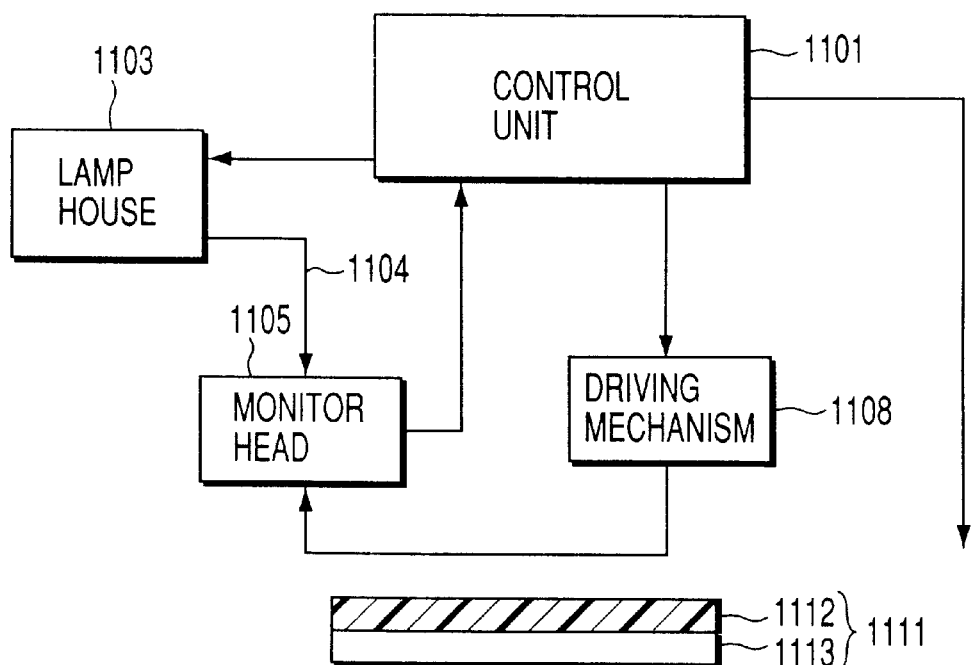
F I G. 11

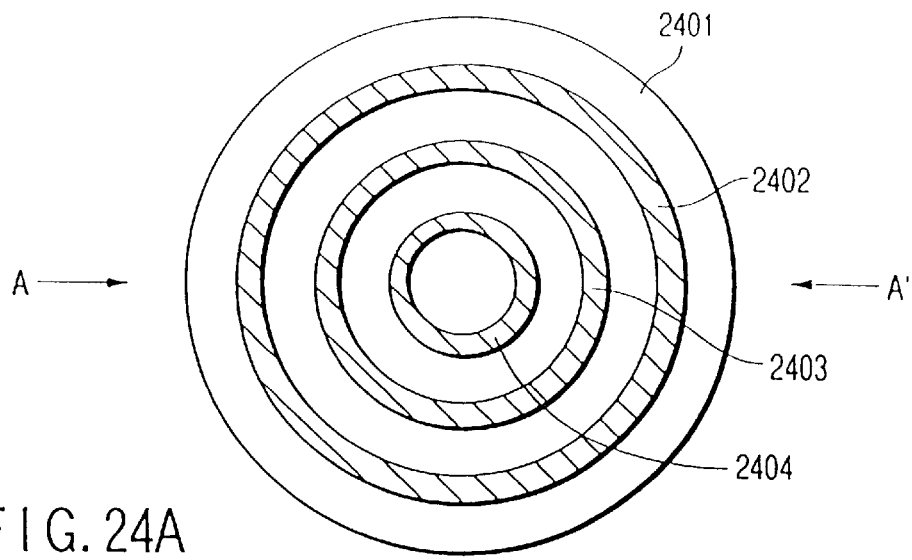
F I G. 24A
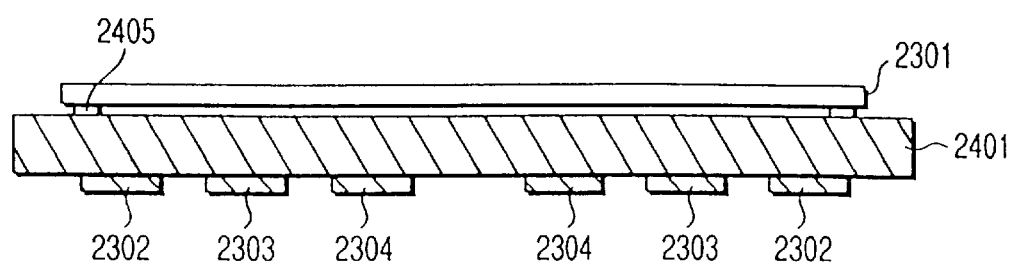
F I G. 24B
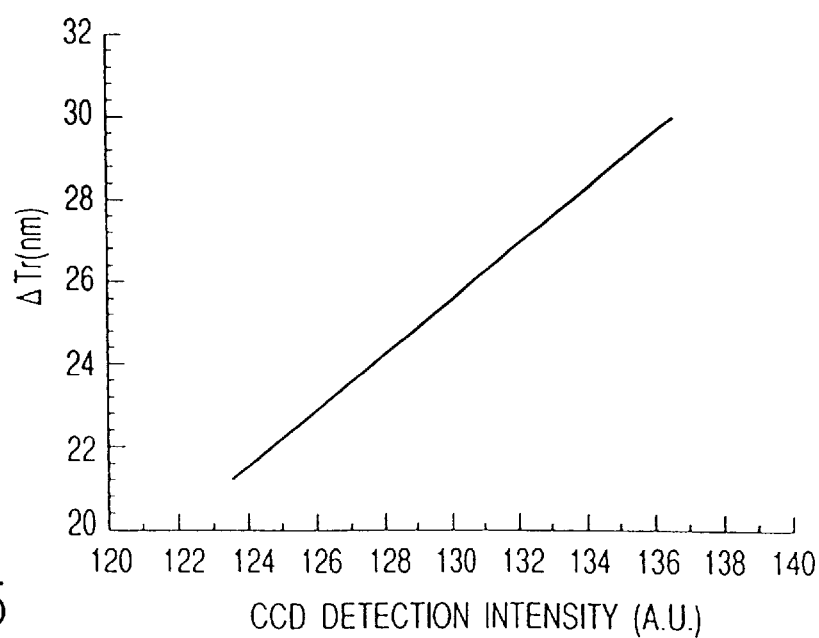
F I G. 25

HEATING DEVICE, METHOD FOR EVALUATING HEATING DEVICE AND PATTERN FORMING METHOD

BACKGROUND OF THE INVENTION

The present invention relates to a heating apparatus for heating a substrate to be treated, and in particular to a heating apparatus suitable for heating a resist pattern before or after exposure in photolithography or the like, a method for evaluating a heating apparatus and a pattern forming method.

Conventionally, a photolithography has been used to form a circuit pattern on a semiconductor apparatus. In the photolithography, heating process (bake) is performed on a resist before or after exposure. Regarding heating a semiconductor wafer (substrate to be treated) before or after exposure, the amount of heat supplied to the semiconductor wafer form a heating plate during heating process has conventionally thought to be constant, and the heating amount has been determined by effecting heating for a constant time period.

In such a method for controlling the heating amount, however, there is a problem that, since a temperature profile during heating is different for each wafer, the heating amount is actually different for each wafer. Also, as the temperature of a wafer can not be measured when there is a temperature distribution in the surface of the wafer, the temperature distribution in the intra-wafer can not be made uniform.

For this reason, when such a resist is used that its pattern dimension changes largely according to the heating amount, variations in dimension have occur on the intra-wafer and the inter-wafer. Furthermore, in the temperature measuring which has been conventionally performed with infrared light, it is the existing situation that, since the infrared light is longer in wavelength than visual light or ultraviolet light, a sufficient accuracy can not be obtained when optical change is monitored using the infrared light.

Also, in order to control a dimension of a resist pattern of intra-wafer with a high accuracy, it is important to control the treating temperature of a semiconductor substrate during heating uniformly and accurately. Specifically, in a lithography step, a temperature uniformity for a bake process after exposure, called PEB (Post Exposure Bake), is regarded as important due to introduction of a chemically amplifying type resist.

In order to attain an intra-wafer uniformity with a high accuracy, it becomes important to measure the surface temperature of a substrate during heating process in its surface accurately to control a heating apparatus.

As one method for measuring the surface temperature of a substrate during heat treatment, such a method is given that a product where such a temperature sensor as thermocouple is embedded in the same substrate as a substrate to be subjected to heat treatment, for example Process Probe 1840 type manufactured by SensArray COP. is heat-treated to be used for a temperature measurement. However, when the bake process is performed in a sealed space in order to take out wires connecting the sensor which has been embedded in the treated substrate and a measuring unit from the bake unit, since the wire injures the sealing condition, it is difficult to reproduce the conditions of the processing time at a time of temperature measurement as it is, thereby lacking measuring accuracy. Also, as conditions such as a position where the substrate is disposed or the like can not be reproduced at the time of temperature measurement, there is a problem that a reliability of the measured result is injured.

Furthermore, when a bake process is effected in a state where such volatile material as solvent is included, a processing container (chamber) is generally exhausted and/or purged by such inert gas as air or nitrogen to form wind flow in the chamber in order to prevent the volatile material from attaching to the processing chamber. When a temperature measurement is conducted by an apparatus where a sensor is embedded in a substrate, the wind flow is disturbed by the wire which has been drawn out, which means that a temperature measurement is performed in a state different from the actual processing state, thereby resulting in a factor deteriorating the measuring accuracy. Also, there is a problem that a temperature lowering due to the exhaust wind can not be measured accurately due to a sealing resin for fixing the sensor.

In order to solve this problem, there has been proposed in Jpn. Pat. Appln. KOKAI Publication No. 11-8180 a method where the surface temperature of a substrate during the bake process is measured over its entire region by an infrared sensor (an infrared thermography process) which has been assembled in a bake unit and temperature control of respective divided heaters is performed on the basis of the temperature distribution information obtained. However, there is a problem that a sufficient measuring accuracy can not be obtained since the value of the temperature measured using the infrared temperature sensor largely depends on a film structure of film thickness of a substrate. There is also a problem that, since an infrared temperature sensor with a high accuracy which can measure a substrate over its entire surface is very expensive in general, the cost for manufacturing the bake unit is increased so that the back unit is impractical.

Meanwhile, there has been proposed in Jpn. Pat. Appln. KOKAI Publication No. 10-275755 a method and an apparatus where the line width of a latent image (an exposed portion/an unexposed portion) after PEB is measured and the measured result is fed back to the PEB temperature condition. In this method, however, there is a merit that no expensive measuring equipment is mounted on the bake unit, but there has occurred a problem that, as the resist latent image does not be made rectangular, it is difficult to measure the line width of the latent image and it is also difficult to feed back the measured result to the PEB temperature condition with a high accuracy.

Also, it is generally difficult to expose an intra-wafer with the completely same exposing amount and variations among respective shots occur. For this reason, it is necessary to uniform the temperature distribution and simultaneously to uniform a distribution of exposing amount actually incident on a resist in order to suppress the variations in dimension. However, it has been impossible to measure the temperature distribution and the actual irradiated exposing amount accurately.

Thus, there has conventionally a problem that, when the heating process is performed before or after exposure on the substrate to be treated on which a resist has been applied, it is impossible to accurately measure the heating amount of the substrate to be treated, to that variations occur in dimension.

Also, the heating temperature of the substrate to be treated can accurately be measured during the heating process so that it is impossible to evaluate a heating apparatus. Also, as the heating temperature can accurately be measured, there is a problem that the heating apparatus can not be controlled so that evenness of the heating temperature occurs in the intra-substrate and variations occurs in dimension of the resist pattern.

Also, there is a problem that the temperature distribution and the distribution of exposing amount of light which has been irradiated actually can accurately not be measured so that an exposing apparatus and the heating apparatus can not be evaluated. Furthermore, there is a problem that since the actual exposing amount and heating temperature can not be measured accurately so that the exposing apparatus and the heating apparatus can not be controlled, thereby resulting in that variations occur in dimension of the resist pattern.

BRIEF SUMMARY OF THE INVENTION

The present invention has been attained in view of the above circumstances and its object is to provide a heating apparatus which can control heating temperature of a substrate to be treated to be constant and which can contribute to reduction of variations in dimension of a resist pattern or the like.

Also, another object of the present invention is to provide a method for evaluating a heating apparatus where temperatures during heat treatment are accurately measured so that a temperature distribution can be obtained.

Furthermore, another object of the invention is to provide a method for evaluating a heating apparatus and an exposing apparatus where an exposing amount which has been irradiated during heat treatment and temperatures during the heat treatment are accurately measured so that an exposing amount distribution and a temperature distribution can be obtained.

Also, another object of the invention is to provide a pattern forming method which can reduce the variations in dimension of a resist pattern or the like by measuring temperatures during heat treatment to obtain a temperature distribution, thereby reducing the size irregularity of resist patterns.

Further, another object of the invention is to provide a pattern forming method which can reduce variations in dimension of a resist pattern or the like by accurately measuring the exposing amount which has been irradiated actually during exposure and temperatures during heat treatment to obtain a temperature distribution, thereby controlling an exposing apparatus and a heating apparatus.

In order to solve the above problems, the present invention employs is the following configuration.

That is, according to a first aspect of the present invention, there is provided a heating apparatus for performing heat treatment on a substrate to be treated on which a resist is applied before or after exposure, the heating apparatus comprising heating means for heating a substrate to be treated; light intensity detecting means for irradiating visible light or ultraviolet light on the substrate to be treated to detect intensity of reflected light from the substrate; and heating controlling means for controlling heating performed by the heating means on the basis of the detected intensity of reflected light.

Also, according to a second aspect of the present invention, there is provided a heating apparatus for performing heat treatment on a substrate to be treated on which a resist is applied before or after exposure, the heating apparatus comprising heating means for heating a substrate to be treated; light intensity detecting means for irradiating visible light or ultraviolet light on a plurality of places on the substrate to be treated to detect intensities of reflected lights from the respective places; and heating controlling means for controlling heating performed by the heating means on the basis of the detected intensities of reflected lights.

Here, preferred embodiments of the present invention will be proposed as follows:

(1) The heating means has an electrical heating function and comprises a sample stand on which a substrate to be treated is placed.

(2) The visible light or the ultraviolet light irradiated on the substrate to be treated is light whose band has been narrowed.

(3) The light intensity detecting means irradiates light on any place on the substrate to be treated and detects film thickness change due to composition change in the resist on the substrate to be treated as change in the intensity of reflected light.

(4) The light intensity detecting means irradiates light on an exposure region on the substrate to be treated and detects a latent image change of a resist on the substrate to be treated, as change in the intensity of reflected light.

(5) The light intensity detecting means has a function capable of recognizing the detected region of the intensity of reflected light as an image and a function for calculating the intensity of the detected region.

(6) The light intensity detecting means includes a mechanism for moving a light detecting device to the detection region for detecting the intensity of reflected light, a optical system capable of detecting only the reflected light from the detection region, and a mechanism for calculating the intensity of the detection region.

(7) The heating controlling means determines the next heating amount on the basis of the accumulated heating amount obtained from the intensity of reflected light and controls the heating means so as to obtain the determined heating amount.

(8) The heating controlling means determines the next heating amount on the basis of differentiated value of the accumulated heating amount obtained the intensity of reflected light and controls the heating means so as to obtain the determined heating amount.

(9) The heating controlling means controls on/off of the heating means on the basis of the determined heating amount while the power of the heating means is kept constant.

(10) The heating controlling means controls current of the heating means on the basis of the determined heating amount while the voltage of the heating means is kept constant.

(11) The heating controlling means controls voltage of the heating means on the basis of the determined heating amount while current of the heating means is kept constant.

(12) The heating controlling means determines a time when the detected intensity of reflected light has become a predetermined intensity of reflected light at a heating terminating time obtained in advance as a heat treatment terminating time.

Also, according to a third aspect of the present invention, there is provided a method for evaluating a heating apparatus comprising: a step for forming a photosensitive resin film on a substrate; a step for performing exposure on a plurality of exposure regions on the photosensitive resin film in an irradiation amount Dopt; a step for performing heat treatment on the photosensitive resin film to measure the film thickness of the photosensitive resin film at an unexposed domain adjacent to each exposure region, thereby obtaining a film thickness difference ΔTr between the exposed domain and the unexposed domain; and a step for obtaining a heating temperature distribution from the film thickness difference ΔTr in each obtained exposure region and a relationship between a film thickness difference ΔTr which has been obtained in advance and heating treating temperature.

In this invention according to the third aspect of the present invention, it is preferable that the irradiation amount Dopt is set such that the change amount $\partial \Delta Tr/\partial T$ to the temperature of the film thickness ΔTr becomes an extreme value or the maximum value.

Also, according to a fourth aspect of the present invention, there is provided a method for evaluating a heating apparatus/an exposing apparatus, comprising: a step for forming a photosensitive resin film on a substrate; a step for applying irradiation amounts Dopt1 and Dopt2 different from each other to a first exposure portion and a second exposure portion adjacent to each other on a plurality of exposure regions on the photosensitive resin film by one time irradiation; a step for performing heat treatment on the photosensitive resin film to measure the film thickness of the photosensitive resin film at the first and second exposure portions on each exposure region and an unexposed domain adjacent thereto, thereby obtaining a film thickness difference ΔTr1 between the first exposure portion in each exposure region and the unexposed domain and a film thickness difference ΔTr2 between the second exposure portion and the unexposed domain; and a step for obtaining heating temperature during the heat treatment and a distribution of irradiation amount applied by one time irradiation from the film thickness differences ΔTr1 and ΔTr2 in each measured exposure region and a relationship between change in film thickness difference to change of exposing amount which has been obtained in advance and change in film thickness difference to change in treating temperature.

Also, the according to a fifth aspect of the present invention, there is provided a pattern forming method where pattern forming is performed, wherein after adjusting a heating apparatus including: a step for forming a photosensitive resin film on a substrate; a step for performing exposure on an exposure region on the photosensitive resin film in an irradiation amount Dopt; a step for performing heat treatment on the photosensitive resin film by a heating apparatus to measure the film thickness of the photosensitive resin film at an unexposed domain adjacent to the exposure region, thereby measuring a film thickness difference ΔTr between the exposure region and the unexposed domain; a step for obtaining heating temperature during the heat treatment from the film thickness difference ΔTr in the measured exposure region and a relationship between a film thickness difference ΔTr which has been obtained in advance and heating treating temperature; and a step for adjusting the heating apparatus from the obtained heating temperature, and the method comprising: a step for forming a resist film on a substrate to be treated; a step for transferring a pattern formed on a projection substrate onto the resist film; a step for performing heat treatment on the resist film by the heating apparatus; and a step for applying developing liquid to the resist film to selectively remove a portion of the resist film.

Furthermore, according to a sixth aspect of the present invention, there is provided a pattern forming method including a step for forming a resist film on a substrate to be treated; a step for performing exposure in an exposing amount Dopt to transfer a pattern formed on a projection substrate onto the resist film; and a step for applying developing liquid to the resist film to selectively remove a portion of the resist film, wherein, the heat treatment comprises the steps of; measuring the film thickness of the resist film at an unexposed domain adjacent to the exposure region to measure a film thickness difference ΔTr between the exposure region and the unexposed domain; obtaining heating temperature from the film thickness difference ΔTr in the measured exposure region and a relationship between a film thickness difference ΔTr which has been obtained in advance and heating treating temperature; and heating the resist film while the control conditions of the heating apparatus is being adjusted in response to the obtained the heating temperature.

In this invention according to the sixth aspect of the present invention, it is preferable that the irradiation amount Dopt is set such that the change amount $\partial \Delta Tr/\partial T$ to the temperature of the film thickness ΔTr becomes an extreme value or the maximum value.

Also, according to a seventh aspect of the present invention, there is provided a pattern forming method where after adjusting a heating apparatus/exposing apparatus including: a step for forming a photosensitive resin film on a substrate; a step for applying irradiation amounts Dopt1 and Dopt2 different from each other to a first exposure portion and a second exposure portion adjacent to each other on an exposure region of the photosensitive resin film with one time irradiation by an exposing apparatus; a step for performing heat treatment on the photosensitive resin film by a heating apparatus to measure the film thickness of the photosensitive resin film at the first and second exposure portions in the exposure region and the unexposed domain adjacent to the exposure region, thereby measuring a film thickness difference ΔTr1 between the first exposure portion and the unexposed domain and a film thickness difference ΔTr2 between the second exposure portion and the unexposed domain; a step for obtaining heating temperature during the heat treatment and actual irradiation amounts which have been irradiated on the first and second exposure portions from the film thickness differences ΔTr1 and ΔTr2 in the measured exposure region and a relationship between change in film thickness difference to change in exposing amount which has been obtained in advance and change in film thickness difference to change to the heating treating temperature; and a step for adjusting the heating apparatus/exposing apparatus from the obtained heating temperature and exposing amount, wherein the method comprises a step for forming a resist film on a substrate to be treated; a step for transferring a pattern formed on the exposure projection substrate onto the resist film; a step for performing heat treatment on the resist film by the heating apparatus; and a step for applying developing liquid to the resist film to selectively remove a portion of the resist film.

Furthermore, according to an eighth aspect of the present invention, there is provided a pattern forming method comprising a step for forming a resist film on a substrate to be treated; a step for performing exposure on the resist film by an exposing apparatus to transfer a pattern formed on a projection substrate onto the resist film; a step for performing heat treatment on the resist film by a heating apparatus; and a step for applying developing liquid to the resist film to selectively remove a portion of the resist film, wherein the transferring step comprises applying irradiation amounts Dopt1 and Dopt2 different from each other to a first exposure portion and a second exposure portion adjacent to each other on a monitor region of the resist film, and the heat treatment step comprises measuring the film thickness of the resist film at the first and second exposure portions and an unexposed domain adjacent thereto on the monitor region to measure a film thickness difference ΔTr1 between the first exposure portion and the unexposed domain on the monitor region and a film thickness difference ΔTr2 between the second exposure portion and the unexposed domain; obtaining heating temperature on the monitor region from the film thickness differences $\Delta Tr1$ and $\Delta Tr2$ on the measured monitor region and a relationship between change in film thickness difference to change in exposing amount which has been obtained in advance and change in film thickness difference to change in treating temperature; and heating the resist film while the control conditions of the heating apparatus is being adjusted in response to the obtained heating temperature.

Uniformity in dimension of intra-substrate and inter-substrate to be treated has been required according to making treating size fine. In a resist whose dimensions change largely according to heating temperature applied to the resist, evenness of the temperature applied to intra-substrate and inter-substrate to be treated has been required specifically.

In the present invention, an heating amount applied to a substrate to be treated is monitored by optically capturing information of a resist itself on the substrate to be treated during heating, namely change in film thickness or change in latent image. Further, the monitoring is performed using visible light or ultraviolet light having a shorter wavelength than infrared light. By reflecting this results on the heating means, it becomes possible to improve the evenness of the heating amount of the intra-substrate to be treated and the evenness of the heating amount of the inter-substrate to be treated, so that the uniformity in dimensions on the intra-substrate and the inter-substrate can be improved largely.

Accordingly, according to the present invention, the heating amount applied to a substrate to be treated can be controlled to be constant, and variations in dimensions of a resist pattern can be reduced, so that the present invention can contribute to improvement in reliability and production yield of the apparatuses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a schematic diagram of a heating apparatus according to a fourth embodiment of the present invention.

FIG. 9 is a block diagram of a heating amount monitor according to the fourth embodiment of the present invention.

FIG. 10 is a schematic diagram of a heating apparatus according to a fifth embodiment of the present invention.

FIG. 11 is a block diagram of a heating amount monitor according to the fifth embodiment of the present invention.

FIG. 24A is a plan view of the rear side of a bake unit HP3.

FIG. 24B is a cross-sectional view of the bake unit HP3 shown in FIG. 24A, taken on the line A–A'.

FIG. 25 is a characteristic graph showing the relationship between the film thickness difference $\Delta Tr$ and the detected intensity of the 0th-order light.

DETAILED DESCRIPTION OF THE INVENTION

Hereinafter details of the present invention will be explained with reference to illustrated embodiments.

First Embodiment

Figure 1:
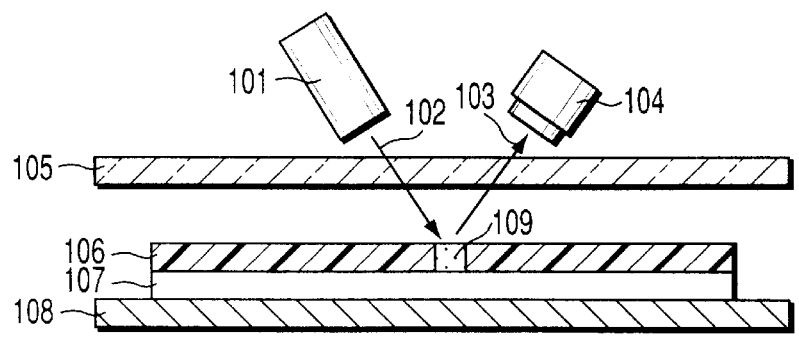
FIG. 1 is a schematic diagram of a heating apparatus according to a first embodiment of the present invention.

FIG. 1 is an apparatus configuration diagram of an embodiment, wherein the present invention is utilized in a heating amount monitor at the time of heating an exposed wafer. Although the incident light and the 0th-order light are slant here, they can be perpendicular. Moreover, the substrate to be treated is a wafer here, but it can be adopted to all kinds of substrates, such as reticles and substrates for liquid crystals.

In the heating apparatus according to this embodiment, a measuring light 102 is incident on a wafer 107 placed on a heat plate 108 from a light source 101 via an observation window 105 provided above. The observation window 105 has a sufficient transmissivity with respect to the measuring light 102. The 0th-order light 103 from the wafer 107 is detected by a CCD camera 104 via the observation window 105. The area of the monitor pattern is recognized by the image process so that the 0th-order light intensity from the monitor pattern 109 is calculated.

Figure 2:
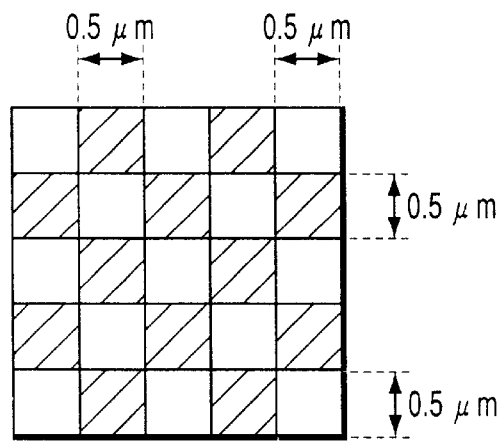
FIG. 2 is a diagram showing an example of a monitor pattern according to the first embodiment of the present invention.

The monitor pattern 109 is a latent image formed on the resist 106 on the wafer 107 by exposure, and can be placed in a domain different from that of the device pattern. Moreover, the pattern to be monitored can be the device pattern itself, but it is preferably a pattern more sensitive concerning the change of the 0th-order light intensity with respect to the heating temperature. As an example of the monitor pattern, a checkered pattern with a 0.5 μm hole diameter as shown in FIG. 2 is used herein.

Figure 3:
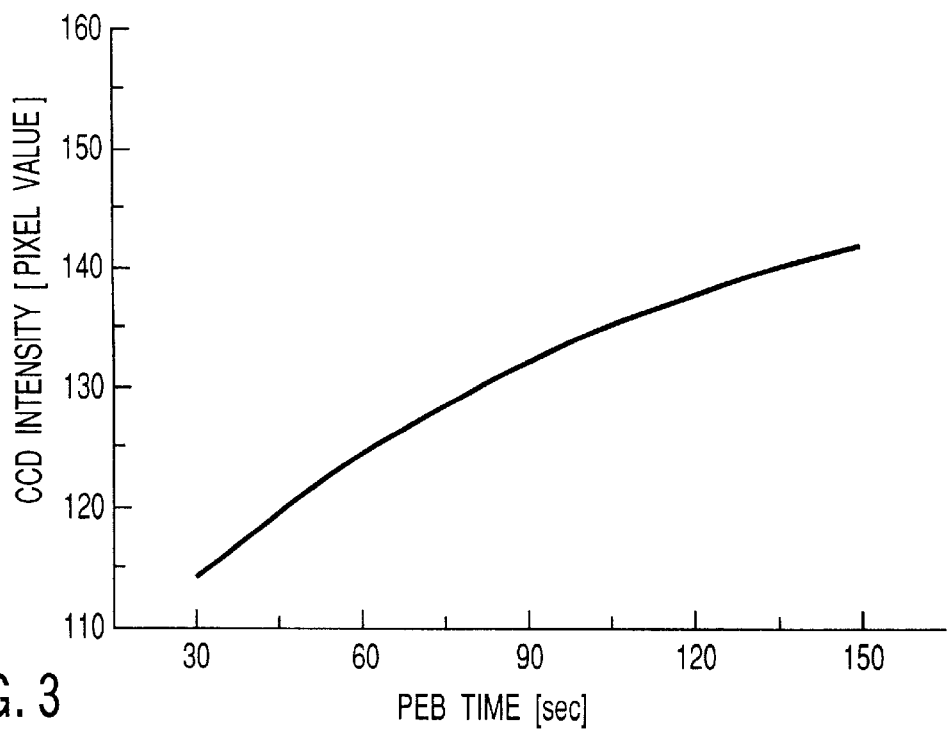
FIG. 3 is a graph showing the relationship between the PEB temperature and the latent image intensity according to the first embodiment of the present invention.
Figure 21:
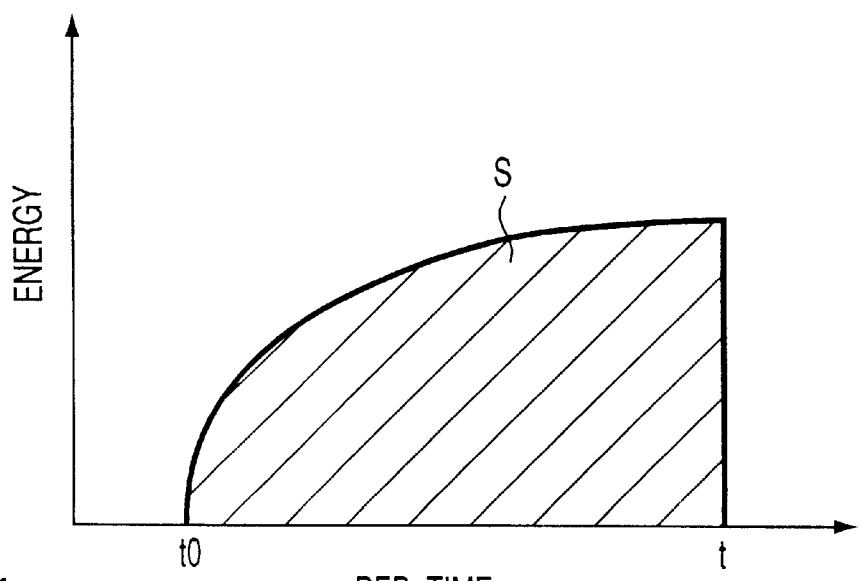
FIG. 21 is a graph showing the relationship between the PEB time and the energy.

The relationship between the PEB time and the 0th-order light intensity with a 140° C. bake temperature after exposure (Post Exposure Bake: hereinafter abbreviated as PEB) with the apparatus of this embodiment is shown in FIG. 3. It is learned that the 0th-order light intensity changes depending on the PEB time according to the relationship. The change of the 0th-order light intensity indicates the change of the latent image of the monitor pattern portion (optical constant or film thickness), that is, the degree of progress of the reaction (that corresponds with S in FIG. 21). Therefore, by monitoring the change of the latent image, the reaction amount can be grasped directly. By stopping the bake when the latent image changes for a certain amount, the reaction amount of substrates can be controlled to be the same.

According to this embodiment, by utilizing the change by the heating amount of the 0th-order light intensity of the monitor pattern portion being heated and monitoring it, the heating amount of the wafer being heated can be detected accurately. Therefore, by monitoring the heating amount and terminating heating at the time it reaches a desired value, a highly accurate heating amount control can be enabled so that the heating amount per wafer can be constant. Accordingly, the size irregularity of resist patterns among wafers by heating after exposure can be reduced, and as a result, the reliability and the production yield of the devices can be improved.

Second Embodiment

Figure 4:
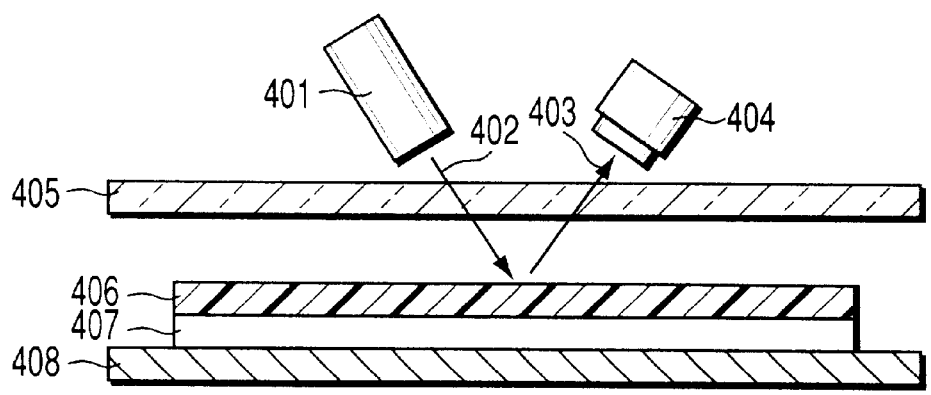
FIG. 4 is a schematic diagram of a heating apparatus according to a second embodiment of the present invention.

FIG. 4 is an apparatus configuration diagram of an embodiment, wherein the present invention is utilized in a heating amount monitor at the time of heating an unexposed wafer. Although the incident light and the 0th-order light are slant here, they can be perpendicular. Moreover, the substrate to be treated is a wafer here, but it can be adopted to all kinds of substrates, such as reticles and substrates for liquid crystals.

In the heating apparatus according to this embodiment, a measuring light 402 is incident on a wafer 407 placed on a heat plate 408 from a light source 401 via an observation window 405 provided above. The observation window 405 has a sufficient transmissivity with respect to the measuring light 402. The 0th-order light 403 from the wafer 407 is detected by a detector 404 via the observation window 405 so that the 0th-order light intensity from the resist 406 is calculated.

Figure 5:
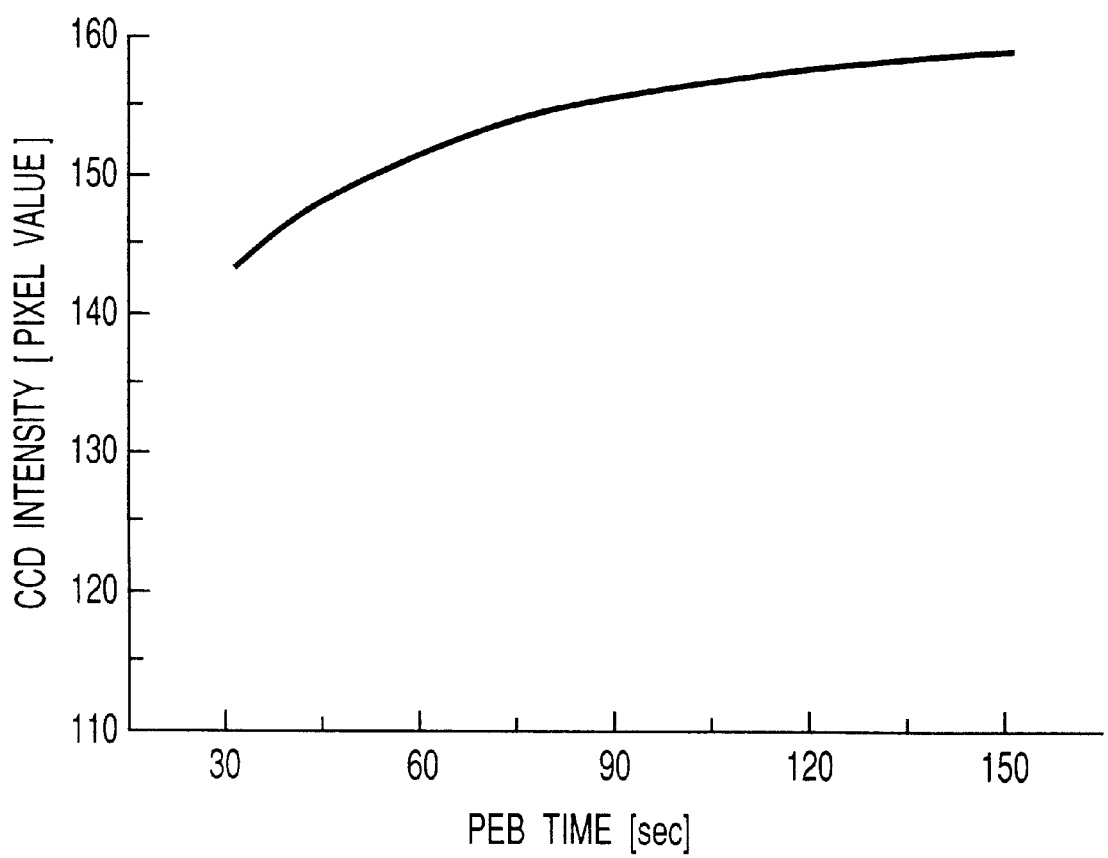
FIG. 5 is a graph showing the relationship between the PAB temperature and the 0th-order light intensity from the resist according to the second embodiment of the present invention.

The relationship between the PAB time and the 0th-order light intensity with a 140° C. bake temperature before exposure (Pre Assist Bake: hereinafter abbreviated as PAB) with the apparatus of this embodiment is shown in FIG. 5. It is learned that the 0th-order light intensity changes depending on the PAB time according to the relationship. The change of the 0th-order light intensity indicates the change of the film thickness of the resist portion generated by vaporization of the solvent from the film. Therefore, by monitoring the change of the film thickness, the vaporization amount of the solvent and the process of the vaporization can be learned. By changing the vaporization amount per unit time, the composition ratio can be changed in the film thickness direction of the resist. Moreover, by stopping the bake when a certain reflection ratio is obtained, a film having a desired film thickness having a desired residual solvent amount can be obtained.

According to this embodiment, by utilizing the change by the heating amount of the 0th-order light intensity of the resist portion being heated and monitoring it, the heating amount of the wafer being heated can be detected accurately. Therefore, by monitoring the heating amount and terminating heating at the time it reaches a desired value, a highly accurate heating amount control can be enabled so that the heating amount per wafer can be constant. Accordingly, the size irregularity among wafers by heating before exposure can be reduced, and as a result, the reliability and the production yield of the devices can be improved.

Third Embodiment

Figure 6:
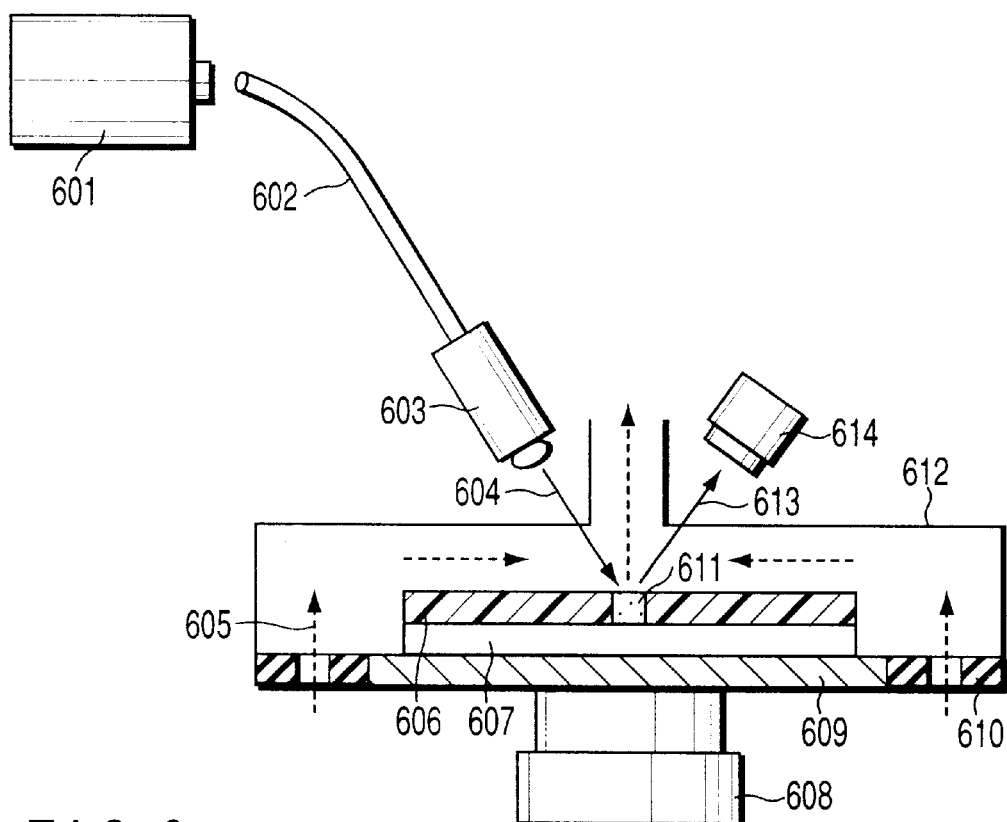
FIG. 6 is a schematic diagram of a heating apparatus according to a third embodiment of the present invention.

FIG. 6 is an apparatus configuration diagram of an embodiment, wherein the present invention is utilized in a heating amount monitor at the time of heating an exposed wafer. Although the incident light and the 0th-order light are slant here, they can be perpendicular. Moreover, the substrate to be treated is a wafer here, but it can be adopted to all kinds of substrates, such as reticles and substrates for liquid crystals.

In the heating apparatus according to this embodiment, a light with the band narrowed to a 470 nm wavelength (half width: 5 nm) by a lamp house 601 capable of dispersing by grating is introduced via an optical fiber 602 to a collimation lens 603 placed separated from a heating unit by an observation window 612. The observation window 612 has a sufficient transmissivity with respect to the measuring light. The light to be incident is made to be a substantially monochrome parallel light 604 by the collimation lens 603 before being incident on a wafer 607 being heated.

The 0th-order light 613 from the wafer 607 is detected by a CCD camera 614 via the observation window 612. The area of the monitor pattern 611 formed on the resist 606 on the wafer 607 is recognized by the image process so that the 0th-order light intensity from the monitor pattern 611 is calculated. Numeral 605 in the figure represents an air flow, 608 an elevator, 609 a heat plate, and 610 an insulating substance. Moreover, as the monitor pattern 611, that explained in the first embodiment can be used. A checkered pattern with a 0.5 μm hole diameter as shown in FIG. 2 is used herein.

Figure 7:
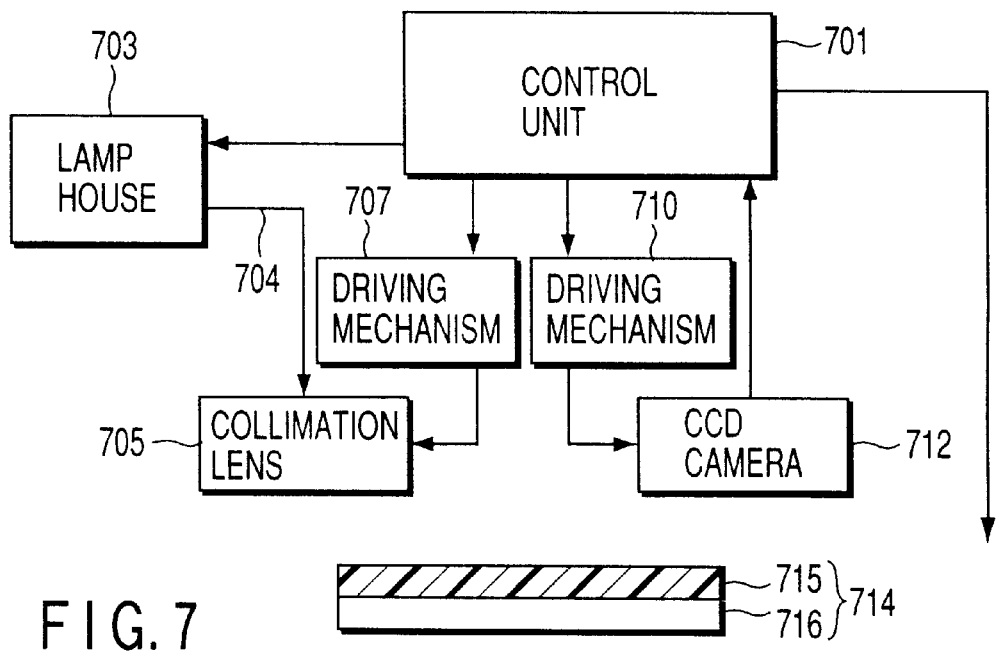
FIG. 7 is a block diagram of a heating amount monitor according to the third embodiment of the present invention.

A block diagram of a heating amount monitor according to the apparatus is shown in FIG. 7. A signal for starting heating is transmitted from a control part 701 to a heating unit 714, a lamp house 703, a driving mechanism 707 for collimation a lens 705, and a driving mechanism 710 for CCD camera 712 so as to start heating. Wavelength information is sent to the lamp house 703 so that a light of a predetermined wavelength is incident on the collimation lens 705 via an optical fiber 704. The collimation lens 705 and the CCD camera 712 move to the monitor pattern position for detecting the 0th-order light intensity from the monitor pattern. Numeral 715 in the figure represents a resist, 716 a wafer.

The relationship between the PEB time and the 0th-order light intensity with a 140° C. PEB temperature with the apparatus of this embodiment is as shown in FIG. 3. It is learned that the 0th-order light intensity changes depending on the PEB time according to the relationship. As described in the first embodiment, the 0th-order light intensity corresponds with the heating amount. Therefore, by monitoring the 0th-order light intensity during heating the wafer, the heating amount can be measured. Accordingly, when a desired heating amount is obtained, the heating operation can be terminated by sending a signal for finishing heating from the control part 701 to the heating unit 714, the lamp house 703, the driving mechanism for collimation lens 707, and the driving mechanism for CCD camera 710.

According to this embodiment, by utilizing the change by the heating amount, of the 0th-order light intensity of the monitor pattern portion being heated and monitoring it, the heating amount of the wafer being heated can be detected accurately. Therefore, as in the first embodiment, the size irregularity of resist patterns among wafers can be reduced by having a constant heating amount per wafer so that the reliability and the production yield of the devices can be improved.

Fourth Embodiment

FIG. 8 is an apparatus configuration diagram of an embodiment, wherein the present invention is utilized in a heating amount monitor at the time of heating an exposed wafer. Although the incident light and the 0th-order light are slant here, they can be perpendicular. Moreover, the substrate to be treated is a wafer here, but it can be adopted to all kinds of substrates, such as reticles and substrates for liquid crystals.

In the heating apparatus according to this embodiment, a light with the band narrowed to a 470 nm wavelength (half width: 5 nm) by a lamp house 801 capable of dispersing by a narrow-band pass filter is introduced via an optical fiber 802 to a monitor head 803 placed separated from a heating unit by an observation window 816. The observation window 816 has a sufficient transmissivity with respect to the measuring light. The light to be incident is made to be a substantially monochrome parallel light 805 by a collimation lens 804 before being incident on a wafer 812 being heated.

The 0th-order light 806 from a resist 811 on the wafer 812 is detected by a fiber 808 via the observation window 816 so that the 0th-order light intensity from the resist unexposed portion is calculated by an intensity measuring device 809. Angles of the incident light fiber 802 and the detection light fiber 808 in the monitor head 803 are adjusted such that the incident light can be detected by the detection fiber. Moreover, the numerical aperture of the lens 807 of the detection fiber is determined such that only the light reflected from the resist unexposed portion can be detected.

Numeral 810 in the figure represents an air flow, 813 a heat plate, 814 an elevator, and 815 an insulating substance.

A block diagram of a heating amount monitor according to the apparatus is shown in FIG. 9. A signal for starting heating is transmitted from a control part 901 to a heating unit 913, a lamp house 903, and a driving mechanism 910 for a monitor head 905 so as to start heating. wavelength information is sent to the lamp house 903 so that a light of a predetermined wavelength is incident on the monitor head 905 via a fiber 904. The monitor head 905 moves to the position of the resist unexposed portion based on the shot map of the wafer and the mask layout. Then, the detected light is sent to an intensity detecting device 907 so as to calculate the 0th-order light intensity from the resist unexposed portion.

Figure 15:
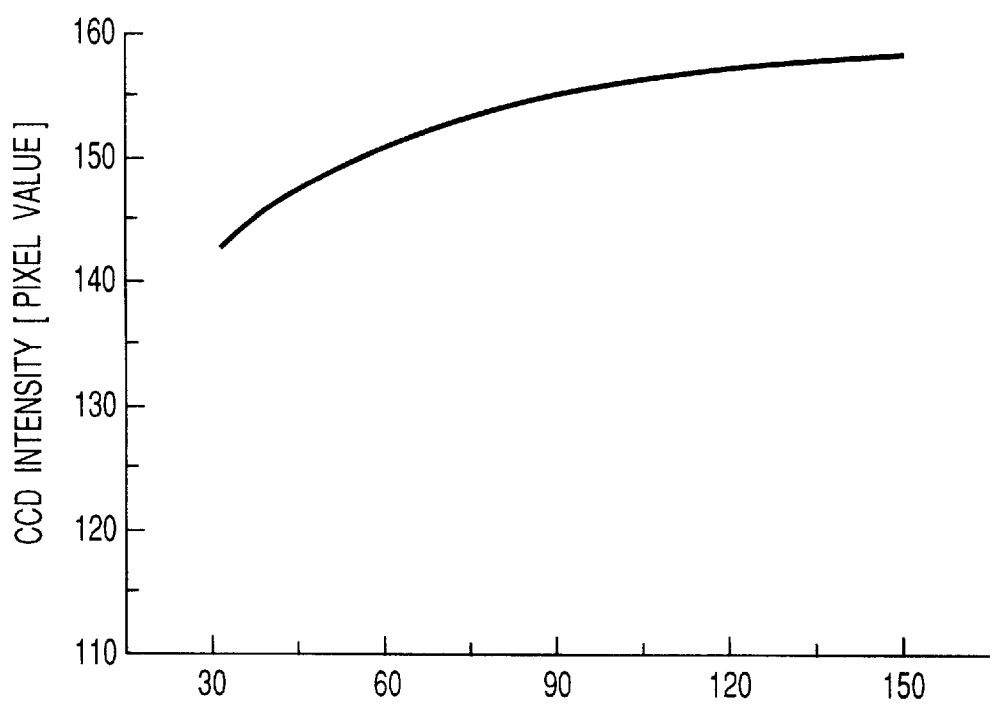
FIG. 15 is a graph showing the relationship between the PEB time and the intensity of the unexposed part of the resist according to the sixth embodiment of the present invention.

The relationship between the PEB time and the 0th-order light intensity with a 140° C. PEB temperature with the apparatus of this embodiment is as shown in FIG. 15. It is learned that the 0th-order light intensity changes depending on the PEB time according to the relationship. As described in the first embodiment, the 0th-order light intensity corresponds with the heating amount. Therefore, by monitoring the 0th-order light intensity during heating the wafer, the heating amount can be measured. Accordingly, when a desired heating amount is obtained, the heating operation can be terminated by sending a signal for finishing heating from the control part 901 to the heating unit 913, the lamp house 903, and the driving mechanism for monitor head 910.

According to this embodiment, by utilizing the change by the heating amount, of the 0th-order light intensity of the resist unexposed portion being heated and monitoring it, the heating amount of the wafer being heated can be detected accurately. Therefore, as in the first embodiment, the size irregularity of resist patterns among wafers can be reduced by having a constant heating amount per wafer so that the reliability and the production yield of the devices can be improved.

Fifth Embodiment

FIG. 10 is an apparatus configuration diagram of an embodiment, wherein the present invention is utilized in a heating amount monitor at the time of heating an exposed wafer. Although the incident light and the 0th-order light are perpendicular here, they can be slant. Moreover, the substrate to be treated is a wafer here, but it can be adopted to all kinds of substrates, such as reticles and substrates for liquid crystals.

A light 1002 with the band narrowed to a 470 nm wavelength (half width: 5 nm) by a lamp house 1001 capable of dispersing by a narrow-band pass filter is introduced via an optical fiber 1002 to a monitor head 1003 placed separated from a heating unit by an observation window 1013. The observation window 1013 has a sufficient transmissivity with respect to the measuring light. The light to be incident is made to be a substantially monochrome parallel light by a collimation lens 1004 before being incident on a wafer 1008 being heated.

The 0th-order light from the wafer 1008 is detected by a CCD camera 1005 via the observation window 1013. The area of the monitor pattern 1009 formed on the resist 1007 is recognized by the image process so that the 0th-order light intensity from the monitor pattern 1009 is calculated. The angle of the incident light fiber 1002 and the detection angle of the CCD camera 1005 are set to be equal. As the monitor pattern 1009, that explained in the first embodiment can be used. A checkered pattern with a 0.5 μm hole diameter as shown in FIG. 2 is used herein.

Numeral 1006 in the figure represents an air flow, 1011 an elevator, 1010 a heat plate, and 1012 an insulating substance.

A block diagram of a heating amount monitor according to the apparatus is shown in FIG. 11. A signal for starting heating is transmitted from a control part 1101 to a heating unit 1111, a lamp house 1103, and a driving mechanism 1108 for a monitor head 1105 so as to start heating. Wavelength information is sent to the lamp house 1103 so that a light of a predetermined wavelength is incident on the monitor head 1105 via a fiber 1104. The monitor head 1105 moves to the position of the monitor pattern portion based on the shot map of the wafer and the mask layout for calculating the 0th-order light intensity. Numeral 1112 in the figure represents a resist, and 1113 a wafer.

Figure 12:
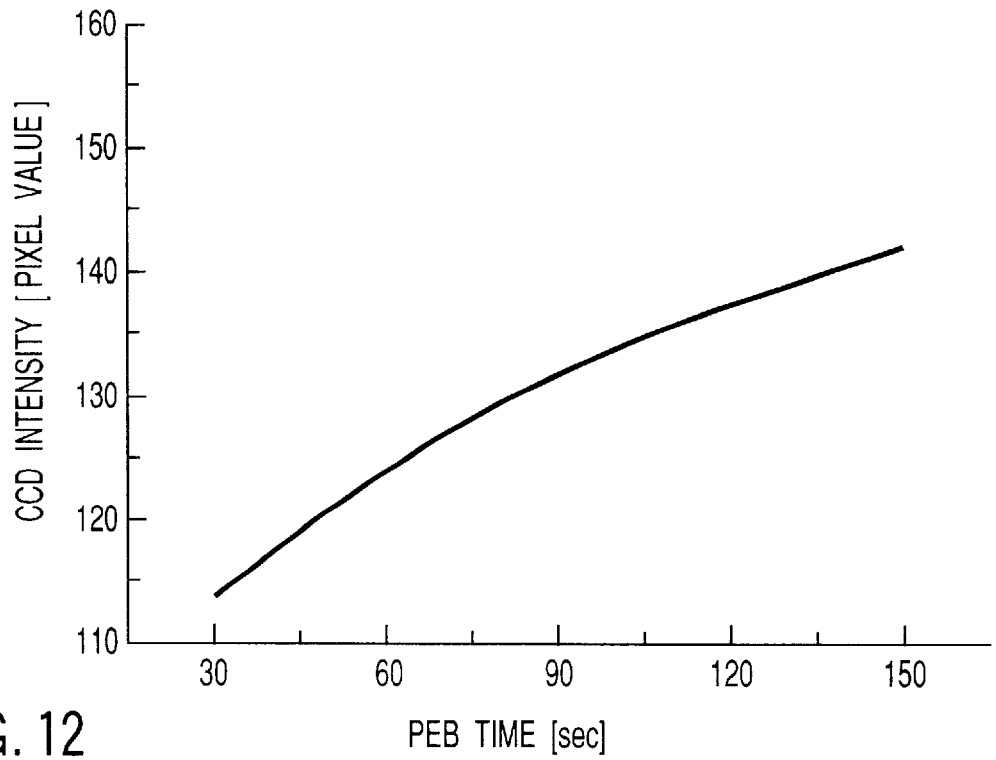
FIG. 12 is a graph showing the relationship between the PEB temperature and the latent image intensity according to the fifth embodiment of the present invention.

The standard condition of the PEB is defined to be a 140° C. PEB temperature and a 90 seconds PEB time. The relationship between the PEB time and the reflected light intensity of the pattern latent image with a constant 140° C. PEB temperature is as shown in FIG. 12. Since the wafer temperature cannot be constant in the actual process, the reflected light profile is not identical with FIG. 12. Therefore, the integrated value of the heating amount is calculated from the reflected light intensity at a certain PEB time, and the heating amount for the next period of time is determined based on the integrated value.

Sixth Embodiment

Figure 13:
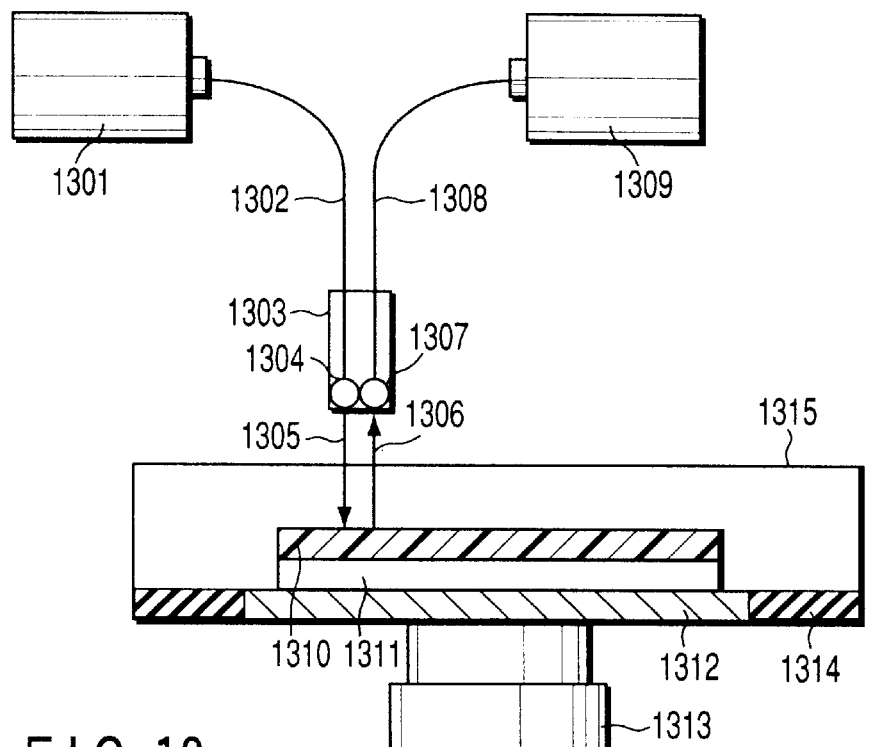
FIG. 13 is a schematic diagram of a heating apparatus according to a sixth embodiment of the present invention.

FIG. 13 is an apparatus configuration diagram of an embodiment, wherein the present invention is utilized in a heating amount monitor at the time of heating an exposed wafer. Although the incident light and the 0th-order light are perpendicular here, they can be slant. Moreover, the substrate to be treated is a wafer here, but it can be adopted to all kinds of substrates, such as reticles and substrates for liquid crystals.

A light with the band narrowed to a 470 nm wavelength (half width: 5 nm) by a lamp house 1301 capable of dispersing by grating is introduced via an optical fiber 1302 to a monitor head 1303 placed separated from a heating unit by an observation window 1315. The observation window 1315 has a sufficient transmissivity with respect to the measuring light. The light to be incident is made to be a substantially monochrome parallel light 1305 by the collimation lens 1304 before being incident on a wafer 1311 being heated.

The 0th-order light 1306 from the resist 1310 on the wafer 1311 is detected by a fiber 1308 via the observation window 1308 so that the 0th-order light intensity from the resist unexposed portion is calculated by an intensity measuring device 1309. Angles of the incident light fiber 1302 and the When the heating amount is small, it is fed back to the heating unit such that the current value is heightened, on the other hand, when the heating amount is large, it is fed back to the heating unit such that the current value is lowered. Then, when the reflected light intensity value reaches a desired amount at the time of terminating the PEB, the heating operation can be terminated by sending a signal for finishing heating from the control part 1101 to the heating unit 1111, the lamp house 1103, and the driving mechanism for monitor head 1108.

According to this embodiment, by utilizing the change by the heating temperature and the heating time, of the 0th-order light intensity of the monitor pattern portion being heated and monitoring the 0th-order light intensity, the heating amount of the wafer being heated can be detected accurately. Therefore, by the feedback to the heating device for a constant temperature, the temperature of the wafer can be maintained constantly. Moreover, by terminating heating when the heating amount reaches a desired value, the total heating amount can be controlled so that the heating amount per wafer can be constant. Accordingly, the size irregularity of resist patterns among wafers can be reduced by having a constant heating condition per wafer so that the reliability and the production yield of the devices can be improved dramatically. detection light fiber 1308 in the monitor head 1303 are adjusted such that the incident light can be detected by the detection fiber. Moreover, the numerical aperture of the lens 1307 of the detection fiber is determined such that only the light reflected from the resist unexposed portion can be detected. Numeral 1312 in the figure represents a heat plate, 1313 an elevator, and 1314 an insulating substance.

Figure 14:
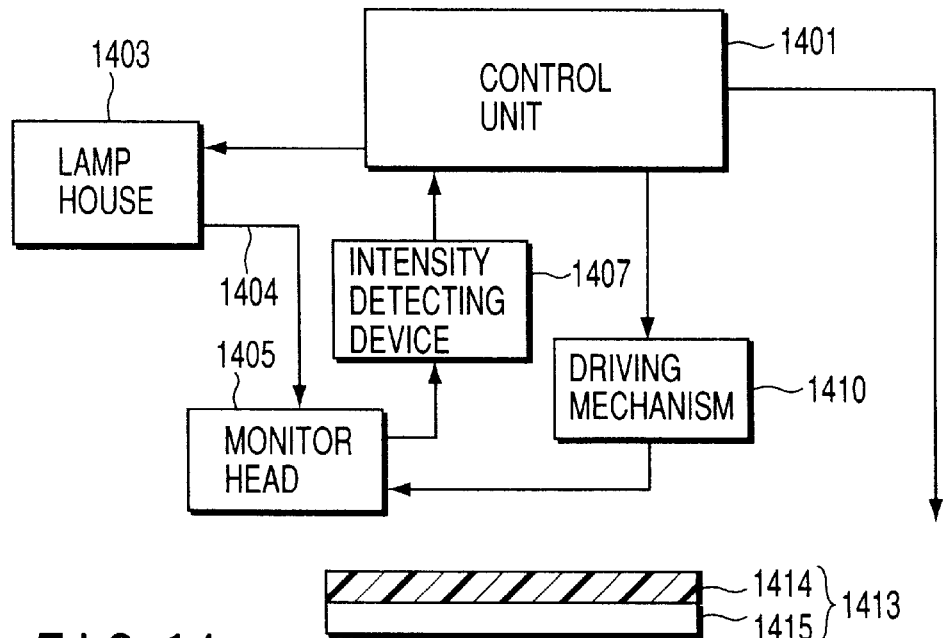
FIG. 14 is a block diagram of a heating amount monitor according to the sixth embodiment of the present invention.

A block diagram of a heating amount monitor according to the apparatus is shown in FIG. 14. A signal for starting heating is transmitted from a control part 1401 to a heating unit 1413, a lamp house 1403, and a driving mechanism 1410 for a monitor head 1405 so as to start heating. Wavelength information is sent to the lamp house 1403 so that a light of a predetermined wavelength is incident on the monitor head 1405 via a fiber 1404. The monitor head 1405 moves to the position of the resist unexposed portion based on the shot map of the wafer and the mask layout. The detected light is sent to an intensity detecting device 1407 so as to calculate the 0th-order light intensity from the resist unexposed portion. Numeral 1414 in the figure represents a resist, and 1415 a wafer.

The standard condition of the PEB is defined to be a 140° C. PEB temperature and a 90 seconds PEB time. The relationship between the PEB time and the reflected light intensity of the resist unexposed portion with a constant 140° C. PEB temperature is as shown in FIG. 15. Since the wafer temperature cannot be constant in the actual process, the reflected light profile is not identical with FIG. 15. Therefore, the integrated value of the heating amount is calculated from the reflected light intensity at a certain PEB time, and the heating amount for the next period of time is determined based on the differential value thereof.

When the heating amount is small, it is fed back to the heating unit such that the voltage value is heightened, on the other hand, when the heating amount is large, it is fed back to the heating unit such that the voltage value is lowered. Then, when the reflected light intensity value reaches a desired amount at the time of terminating the PEB, the heating operation can be terminated by sending a signal for finishing heating from the control part 1401 to the heating unit 1413, the lamp house 1403, and the driving mechanism for monitor head 1410.

According to this embodiment, by utilizing the change by the heating temperature and the heating time, of the 0th-order light intensity of the resist unexposed portion being heated and monitoring the 0th-order light intensity, the heating amount of the wafer being heated can be detected accurately. Therefore, by the feedback to the heating device for a constant temperature, the temperature of the wafer can be maintained constantly. Moreover, by terminating heating when the heating amount reaches a desired value, the total heating amount can be controlled so that the heating amount per wafer can be constant. Accordingly, the size irregularity of resist patterns among wafers can be reduced by having a constant heating condition per wafer so that the reliability and the production yield of the devices can be improved dramatically.

Seventh Embodiment

Figure 16:
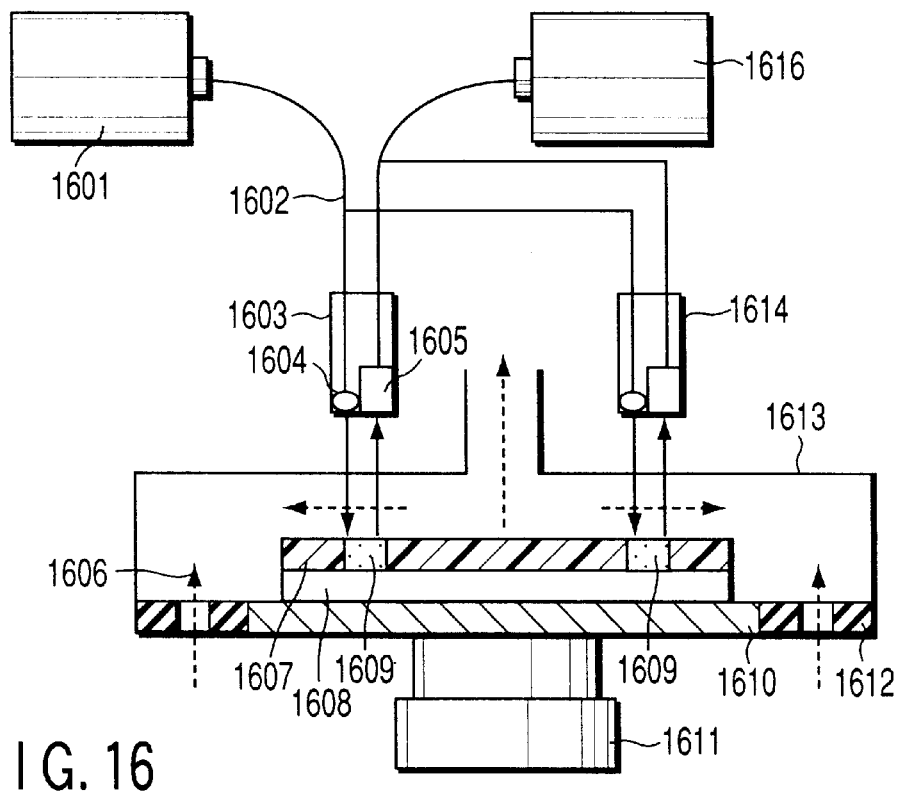
FIG. 16 is a schematic diagram of a heating apparatus according to a seventh embodiment of the present invention.

FIG. 16 is an apparatus configuration diagram of an embodiment, wherein the present invention is utilized in a heating amount monitor at the time of heating an exposed wafer. Although the incident light and the 0th-order light are perpendicular here, they can be slant. Moreover, the substrate to be treated is a wafer here, but it can be adopted to all kinds of substrates, such as reticles and substrates for liquid crystals.

A light with the band narrowed to a 470 nm wavelength (half width: 5 nm) by a lamp house 1601 capable of dispersing by a narrow-band pass filter is introduced via an optical fiber 1602 to two monitor heads 1603, 1614 placed separated from a heating unit by an observation window 1613 (Since both are the same heads, only the configuration of 1603 will be described hereinafter). The observation window 1613 has a sufficient transmissivity with respect to the measuring light. The light to be incident is made to be a substantially monochrome parallel light by a collimation lens 1604 before being incident on a wafer 1608 being heated.

The 0th-order light from the wafer is detected by a CCD camera 1605 via the observation window 1613. The area of the monitor pattern 1609 exposed on the resist 1607 is recognized by the image process so that the 0th-order light intensity from the monitor pattern 1609 is calculated. The angle of the incident light fiber 1603 and the detection angle of the CCD camera 1605 are set to be equal.

Since two monitor heads are used, the monitor pattern 1609 is placed at two points. As the monitor pattern 1609, that explained in the first embodiment can be used. A checkered pattern with a 0.5 μm hole diameter as shown in FIG. 2 is used herein.

Numeral 1606 in the figure represents an air flow, 1611 an elevator, 1610 a heat plate, 1612 an insulating substance, and 1616 a control part.

Figure 17:
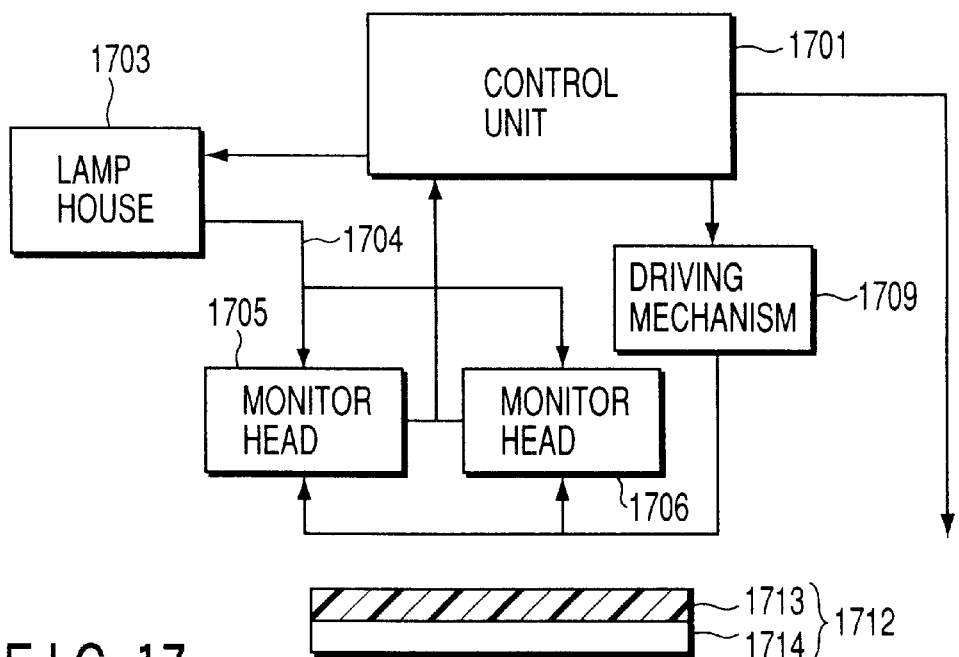
FIG. 17 is a block diagram of a heating amount monitor according to the seventh embodiment of the present invention.

A block diagram of a heating amount monitor according to the apparatus is shown in FIG. 17. A signal for starting heating is transmitted from a control part 1701 to a heating unit 1712, a lamp house 1703, and a driving mechanism 1709 for monitor heads 1705 and 1706 so as to start heating. Wavelength information is sent to the lamp house 1703 so that a light of a predetermined wavelength is incident on the monitor heads 1705, 1706 via a fiber 1704. The monitor heads 1705, 1706 move to the positions of the monitor pattern based on the shot map of the wafer and the mask layout for calculating the 0th-order light intensity. Numeral 1713 in the figure represents a resist, and 1714 a wafer.

The standard condition of the PEB is defined to be a 140° C. PEB temperature and a 90 seconds PEB time. The relationship between the PEB time and the reflected light intensity of the pattern latent image with a constant 140° C. PEB temperature is as shown in FIG. 12. Since the wafer temperature cannot be constant in the actual process and the temperature in the wafer plane is not homogeneous, the reflected light profile measured by the two monitor heads are not identical with FIG. 12. Therefore, the integrated value of the heating amount is calculated from the reflected light intensity at a certain PEB time, and the heating amount for the next period of time is determined based on the integrated value.

When the heating amount is small, it is fed back to the heating unit such that the voltage value is heightened, on the other hand, when the heating amount is large, it is fed back to the heating unit such that the voltage value is lowered. Then, when the reflected light intensity value reaches a desired amount at the time of terminating the PEB, the heating operation can be terminated by sending a signal for finishing heating from the control part 1701 to the heating unit 1712, the lamp house 1703, and the driving mechanism for monitor head 1709.

According to this embodiment, by utilizing the change by the heating temperature and the heating time, of the 0th-order light intensity of the monitor pattern portion being heated and monitoring the 0th-order light intensity, the heating amount of the wafer being heated can be detected accurately. Therefore, as in the fifth embodiment, the temperature of the wafer can be maintained constantly, and furthermore, the heating amount per wafer can be constant. Accordingly, the size irregularity of resist patterns among wafers can be reduced by having a constant heating condition per wafer. Further, by providing a plurality of the monitor heads, the heating uniformity in the wafer plane can be improved, and thus the size irregularity in the wafer plane can be reduced. From the above-mentioned, the reliability and the production yield of the devices can be improved dramatically.

Eighth Embodiment

Figure 18:
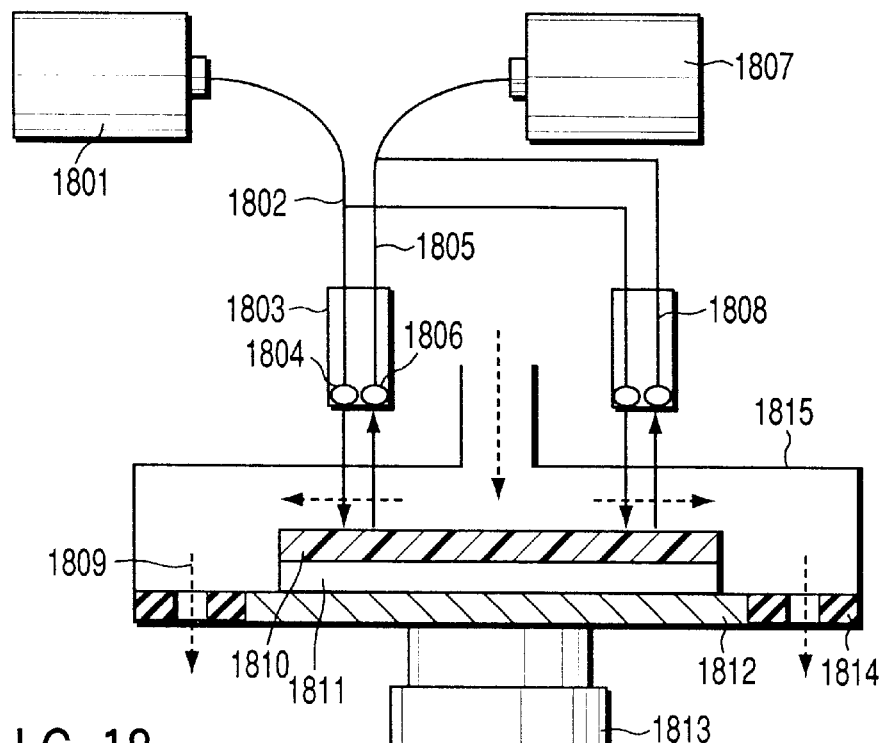
FIG. 18 is a schematic diagram of a heating apparatus according to an eighth embodiment of the present invention.

FIG. 18 is an apparatus configuration diagram of an embodiment, wherein the present invention is utilized in a heating amount monitor at the time of heating an unexposed wafer. Although the incident light and the 0th-order light are perpendicular here, they can be slant. Moreover, the substrate to be treated is a wafer here, but it can be adopted to all kinds of substrates, such as reticles and substrates for liquid crystals.

A light with the band narrowed to a 470 nm wavelength (half width: 5 nm) by a lamp house 1801 capable of dispersing by grating is introduced via an optical fiber 1802 to two monitor heads 1803, 1808 placed separated from a heating unit by an observation window 1815 (Since both are the same heads, only the configuration of 1803 will be described hereinafter). The observation window 1815 has a sufficient transmissivity with respect to the measuring light. The light to be incident is made to be a substantially monochrome parallel light by the collimation lens 1804 before being incident on a wafer 1811 being heated.

The 0th-order light from the resist 1810 on the wafer 1811 is collected by a collective lens 1806 so as to be detected by a fiber 1805. The 0th-order light intensity from the resist 1810 is calculated by an intensity measuring device 1807. Angles of the incident light fiber 1802 and the detection light fiber 1805 in the monitor head 1803 are adjusted such that the incident light can be detected by the detection fiber. Numeral 1809 in the figure represents an air flow, 1813 an elevator, 1812 a heat plate, and 1814 an insulating substance.

Figure 19:
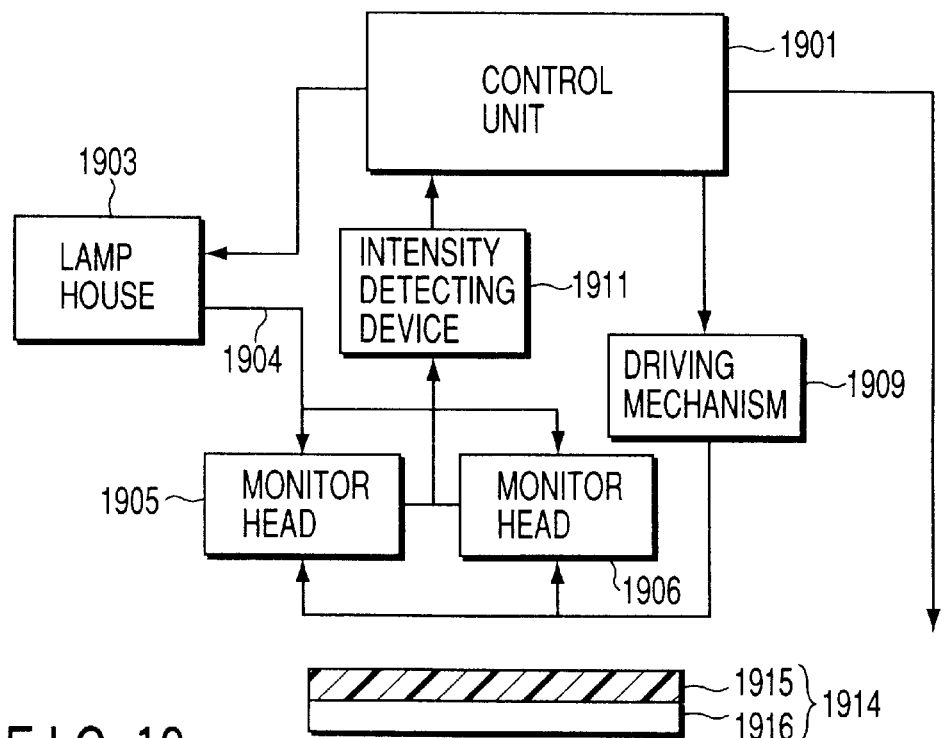
FIG. 19 is a block diagram of a heating amount monitor according to the eighth embodiment of the present invention.

A block diagram of a heating amount monitor according to the apparatus is shown in FIG. 19. A signal for starting heating is transmitted from a control part 1901 to a heating unit 1914, a lamp house 1903, and a driving mechanism 1909 for monitor head 1905 and 1906 so as to start heating.

Wavelength information is sent to the lamp house 1903 so that a light of a predetermined wavelength is incident on the monitor heads 1905, 1906 via a fiber 1904. The monitor heads 1905, 1906 move to the position of the resist of the wafer. The detected light is sent to an intensity detecting device 1911 so as to calculate the 0th-order light intensity from the resist portion. Numeral 1915 in the figure represents a resist, and 1916 a wafer.

Figure 20:
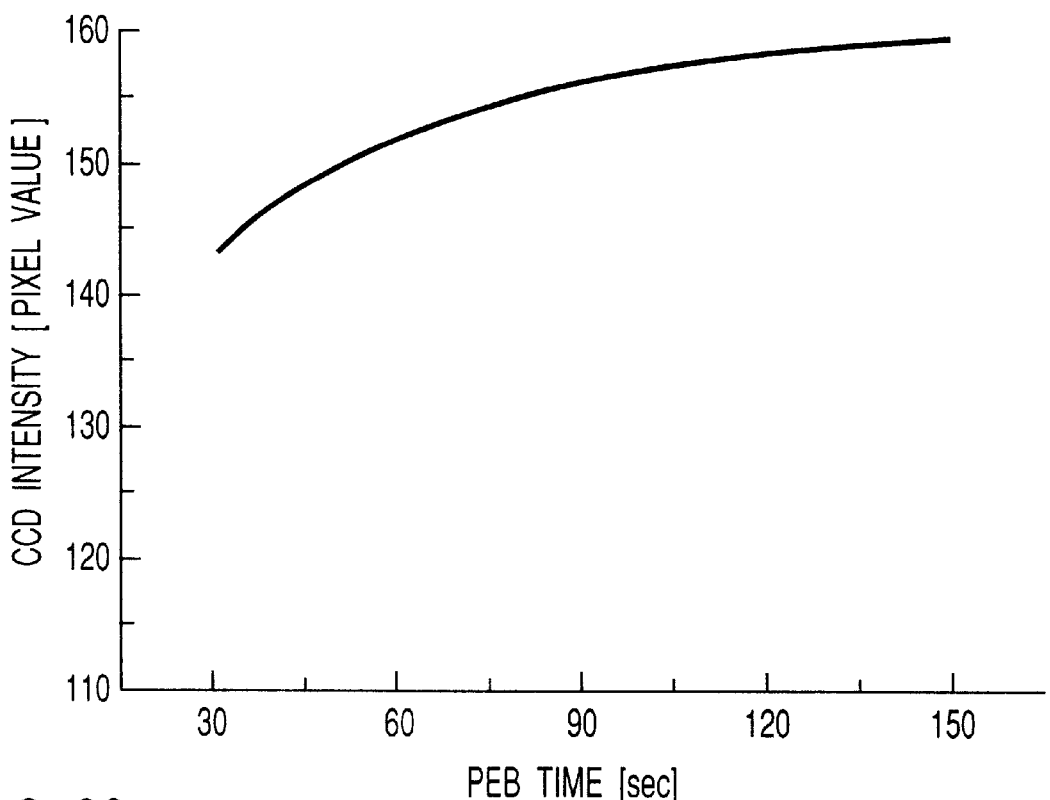
FIG. 20 is a graph showing the relationship between the PAB time and the intensity of the resist part according to the eighth embodiment of the present invention.

The standard condition of the PAB is defined to be a 140° C. PAB temperature and a 90 seconds PAB time. The relationship between the PAB time and the reflected light intensity of the resist with a constant 140° C. PAB temperature is as shown in FIG. 20. Since the wafer temperature cannot be constant in the actual process and the temperature in the wafer plane is not homogeneous, the reflected light profile measured by the two monitor heads are not identical with FIG. 20. Therefore, when each of the reflected lights is smaller than a desired value, it is fed back to the heating unit such that the voltage value is heightened, on the other hand, when each of the reflected lights is larger than a desired value, it is fed back to the heating unit such that the voltage value is lowered at a certain PAB time. Then, when the reflected light intensity value reaches a desired amount at the time of terminating the PAB, the heating operation can be terminated by sending a signal for finishing heating from the control part 1901 to the heating unit 1914, the lamp house 1903, and the driving mechanism for monitor head 1909.

According to this apparatus, by utilizing the change by the heating temperature and the heating time, of the 0th-order light intensity of the resist portion being heated and monitoring the 0th-order light intensity, the heating amount of the wafer being heated can be detected accurately. Therefore, the temperature of the wafer can be maintained constantly, and furthermore, the heating amount per wafer can be constant. Accordingly, the size irregularity of resist patterns among wafers can be reduced by having a constant heating condition per wafer. Further, by providing a plurality of the monitor heads, the heating uniformity in the wafer plane can be improved, and thus the size irregularity in the wafer plane can be reduced. From the above-mentioned, the reliability and the production yield of the devices can be improved dramatically.

Ninth Embodiment

With semiconductor elements being made more and more minute, it is important to control the treatment temperature of semiconductor substrates during production uniformly and accurately for controlling the size highly accurately. Particularly in a lithography step, by the introduction of a chemically amplified type resist, the temperature uniformity of the bake treatment after exposure called PEB (Post Exposure Bake) is regarded as important.

In the embodiment described below, a method of measuring the temperature distribution in the resist film plane in the PEB, with a resist after exposure but before development (photosensitive resin film) used as a temperature measuring medium will be explained. Moreover, a method of evening the temperature distribution from the measured temperature distribution by adjusting the heat treatment device used in the heat treatment will also be explained.

Figure 22:
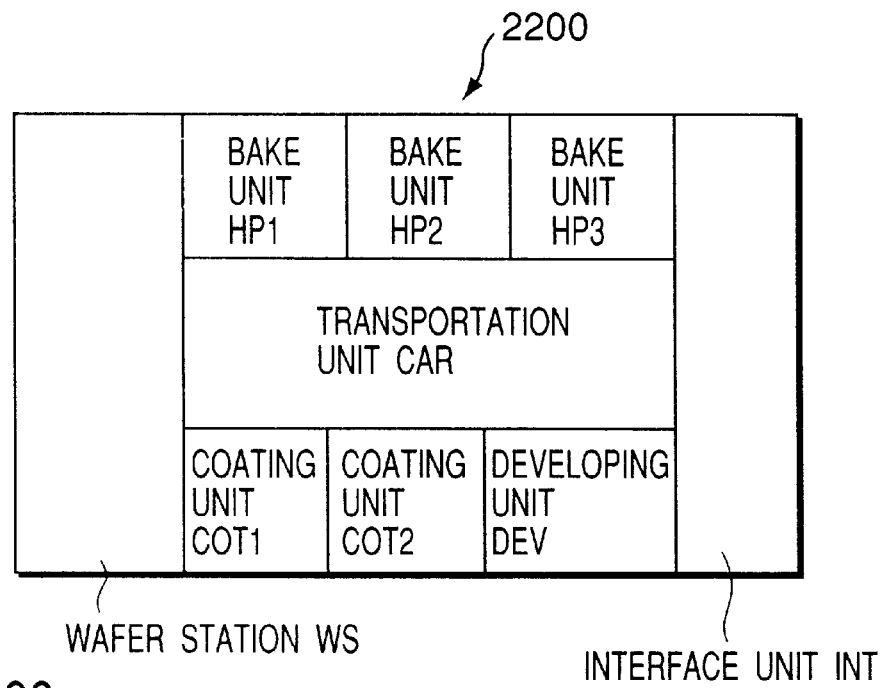
FIG. 22 is a diagram showing the configuration of a treatment system according to a ninth embodiment of the present invention.

FIG. 22 is a schematic diagram of a treatment system for treating a semiconductor substrate (hereinafter referred to as a wafer) in the lithography step. In the treatment system 2200, formation of a reflection preventing film or resist film before exposure, or heat treatment after exposure, developing treatment, or the like, are conducted.

The wafer can be transferred between the treatment system 2200 and an exposing device (not illustrated) via an interface unit INT in the treatment system 2200.

A transportation unit CAR is connected with a wafer station WS on which the wafer is placed. The transportation unit CAR is connected with a coating unit COT1 for coating a reflection preventing film on the wafer, a bake unit HP1 for the bake treatment of the wafer with the reflection preventing film coated thereon, a coating unit COT2 for coating a resist on the wafer, and a bake unit HP2 for the bake treatment of the wafer with the resist coated thereon. Moreover, a bake unit HP3 for the bake treatment of the wafer exposed with the exposing device (not illustrated) is connected with the transportation unit CAR. Further, the transportation unit CAR is connected with a developing unit DEV for the development.

In this embodiment, with the resist coated on the wafer used as the temperature measuring medium, without conducting the developing treatment, the wafer after the PEB (Post Exposure Bake) is evaluated for finding the control condition for the bake unit HP3. Details thereof will be explained below.

The wafer (not illustrated) placed on the wafer station WS is transported to the coating unit COT1 by the transportation unit CAR. After coating a reflection preventing film on the wafer, the wafer is transported to the bake unit HP1 by the transportation unit CAR. The wafer is applied with a bake treatment with a 190° C., 60 seconds condition by the bake unit HP1 so as to form a reflection preventing film having a 60 nm film thickness on the wafer.

Then, after coating a positive type chemically amplified resist on the reflection preventing film by the coating unit COT2 after passing through a cooling unit (not illustrated), the wafer was transported to the bake unit HP2 by the transportation unit CAR. The wafer is applied with a heat treatment for evaporating the solvent in the resist called prebake with a 140° C., 90 seconds condition by the bake unit COT2 so as to form a 400 nm resist film on the reflection preventing film.

Figure 23:
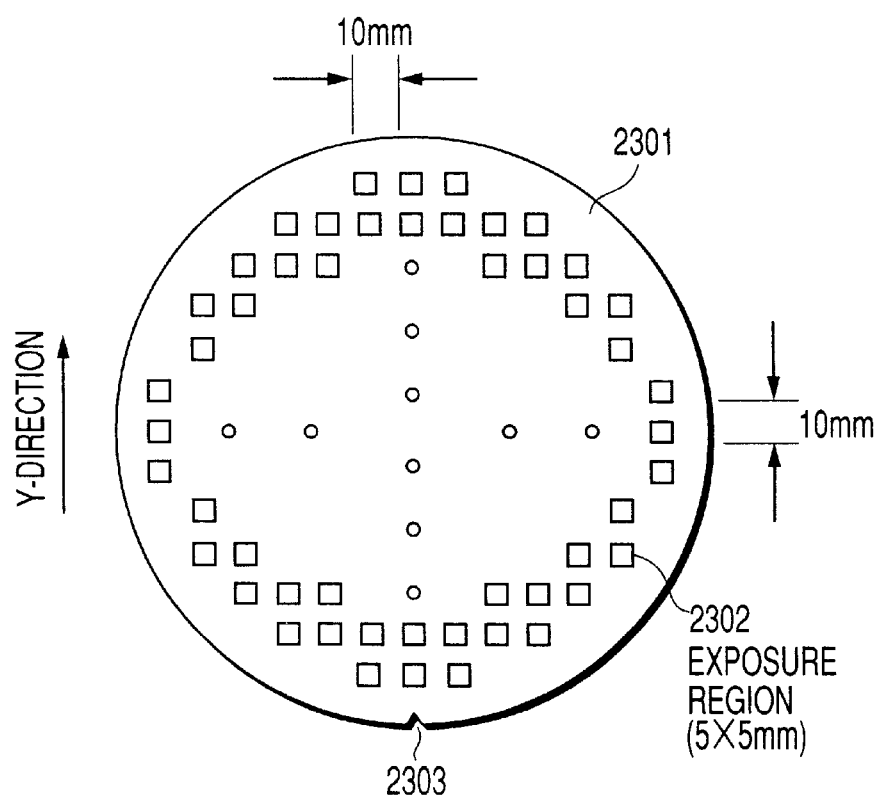
FIG. 23 is a plan view of an exposed wafer.

Then, after cooling the wafer to the vicinity of the room temperature by the cooling unit (not illustrated), it was transported to the exposing device (not illustrated) via the interface unit INT. In this exposing step, as shown in FIG. 23, the chemically amplified type resist coated on the wafer 2301 was exposed with a 13.5 mJ/cm$^2$ exposure amount condition so as to form a 5 mm square exposed domain 2302 in the wafer plane with a 10 mm step in both x direction and y direction. A notch 2303 is a mark for identifying the wafer orientation.

After the exposure, the wafer is returned to the treatment system 2200 via the interface unit INT, and further, is transported to the bake unit HP3 by the transportation unit CAR for conducting the bake treatment after exposure called the PEB (Post Exposure Bake) to the wafer. FIG. 24A is a plan view of the rear side of the bake unit HP3, and FIG. 24B is a cross-sectional view taken on the line A–A'. The bake unit HP3 comprises three concentric heaters 2402, 2403, 2404 provided in a heat equalizing plate 2401. The temperature of each of the heaters 2402 to 2404 is controlled independently by an embedded thermocouple (not illustrated). Then the wafer is placed on a proximity gap 2405 provided on the heat equalizing plate.

First, all the heaters 2402 to 2404 were set at 140° C. The wafer was applied with the PEB treatment with a 140° C., 90 seconds condition by the bake unit HP3. Then, after cooling the wafer to the vicinity of the room temperature by the cooling unit (not illustrated), it was transported to the wafer station WS.

Then, the wafer was taken out from the treatment system for measuring the film thickness in each 5 mm square exposed domain and the adjacent unexposed domain so as to calculate the distribution in the wafer plane by ΔTr=(film thickness of the unexposed domain)−(film thickness of the exposed domain).

Here, the zero-order diffracted light from the center part of the exposed domain of each 5 mm square was observed with a CCD camera for finding out the detected light intensity I. Then, the film thickness difference ΔTr of each exposed domain was found out by the relationship between the preliminarily sought CCD detection intensity shown in FIG. 25 and the film thickness difference ΔTr. The distribution of the found film thickness difference ΔTr is shown in FIG. 26.

Figure 27:
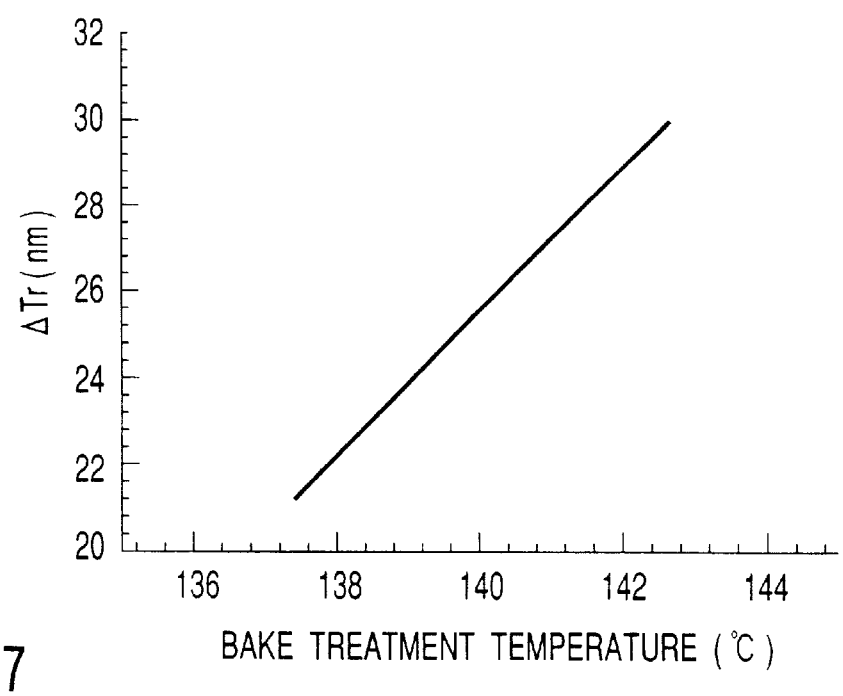
FIG. 27 is a characteristic graph showing the relationship between the film thickness difference $\Delta Tr$ and the heat treatment temperature.

Then, from the found film difference ΔTr, the heat treatment temperature in each exposed domain was found out. For calculating the heat treatment temperature from the film thickness difference ΔTr, the relationship between the preliminarily sought film thickness difference ΔTr shown in FIG. 27 and the heat treatment temperature was used. In finding out the relationship between the film thickness difference ΔTr and the heat treatment temperature, it was fixed at 13.5 mJ/cm$^2$, 90 seconds.

Figure 26:
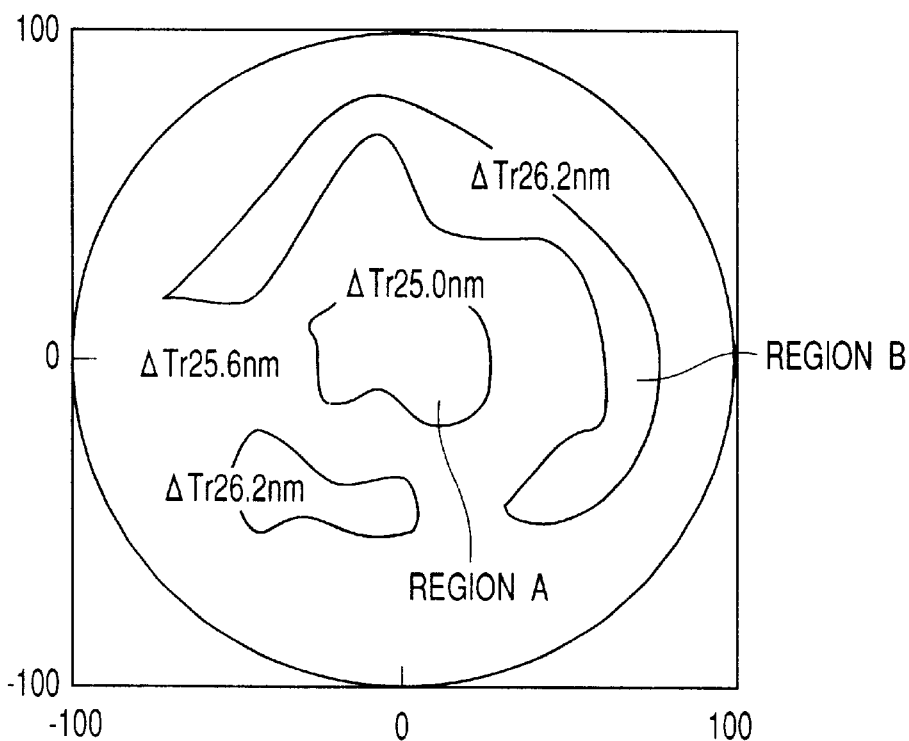
FIG. 26 is a graph showing the distribution of the film thickness difference $\Delta Tr$ of the wafer.

The film thickness difference ΔTr in the domain A and the domain B shown in FIG. 26 was 25.0 nm and 26.2 nm, respectively. By calculating the film thickness difference ΔTr to the temperature T from the relationship shown in FIG. 27, it was 139.6° C. in the domain A, and 140.4° C. in the domain B. Therefore, the treatment temperature was lower than the desired temperature (140° C.) by 0.4°C. in the domain A, but was higher by 0.4° C. in the domain B.

Based on the result, the control condition of the heater 2404 corresponding to the position of the domain A and the control condition of the heater 2403 corresponding to the position of the domain B were adjusted such that the wafer surface temperature in the domain A can be higher by 0.4° C., and the surface temperature in the domain B can be lower by 0.4° C. By conducting such temperature distribution evaluation in the plane and adjustment of the heater control repeatedly, the temperature uniformity in the plane (3σ) was improved from 0.45° C. to 0.10° C.

As mentioned above, by adjusting the set temperature of each heater according to the film thickness difference ΔTr, a further homogeneous bake treatment can be realized in the wafer plane.

The exposure amount condition 13.5 mJ/cm$^2$ at the time of exposing the domain to be exposed of the wafer was calculated by the procedure described below.

Figure 28:
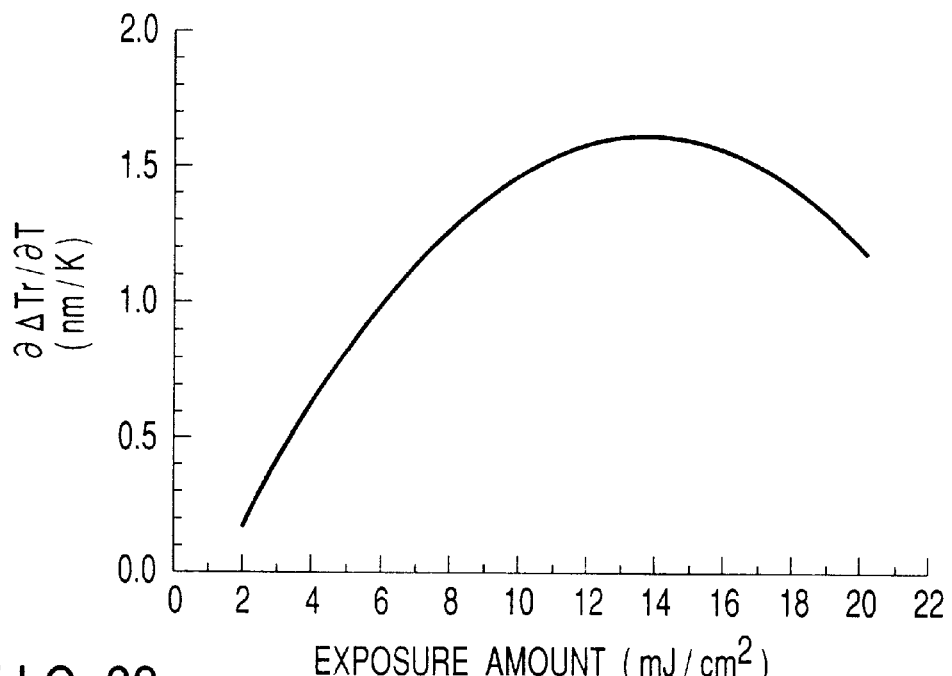
FIG. 28 is a characteristic graph showing the exposure amount dependency of the $\partial \Delta Tr/\partial T$.

The relationship between the $\partial \Delta Tr/\partial T$ (T is temperature) and the exposure amount in the vicinity of 140° C. is shown in FIG. 28. Here, the $\partial \Delta Tr/\partial T$ indicates the change amount of the film thickness difference ΔTr with respect to the temperature T so that with a larger value thereof, the film thickness difference ΔTr (reaction amount) changes sensitively with respect to the temperature, and thus the resolution ability with respect to the temperature is improved. The resist used in this embodiment has a largest $\partial \Delta Tr/\partial T$ with a 13.5 mJ/cm$^2$ exposure amount so that the resolution ability with respect to the temperature is enlarged as shown in FIG. 28.

Moreover, in general, it is difficult to expose the wafer plane with the completely same exposure amount, and thus, the exposure amount irregularity is generated among shots. Since the film thickness difference ΔTr is a function of the temperature T and the exposure amount D, for detecting the temperature distribution from the film thickness difference ΔTr, it is preferable that the change of the film thickness difference ΔTr is small with respect to the exposure amount change.

Figure 29:
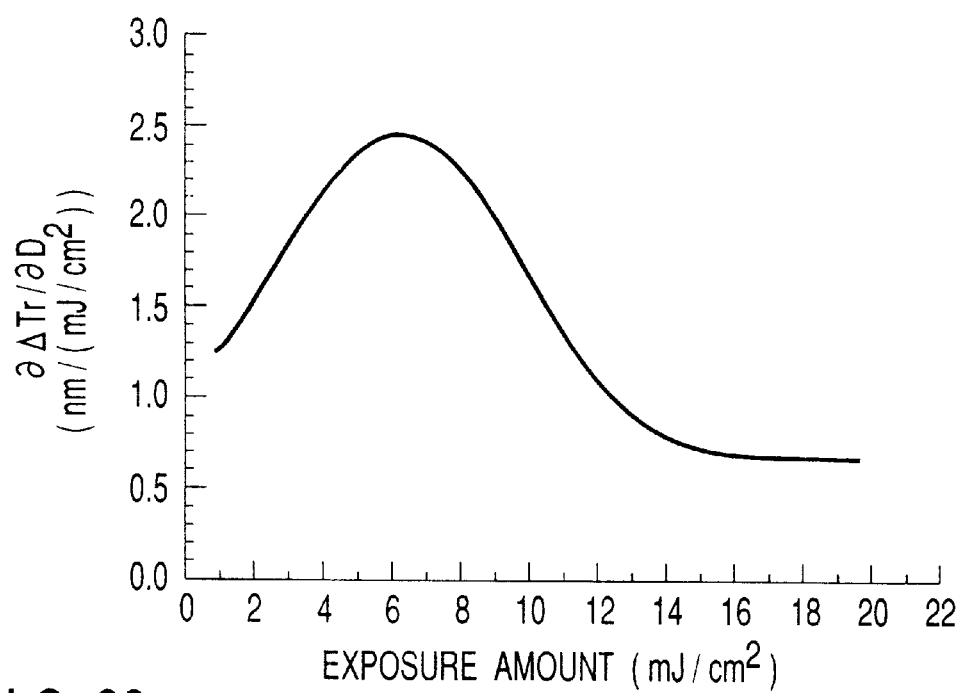
FIG. 29 is a characteristic graph showing the exposure amount dependency of the $\partial \Delta Tr/\partial D$.

The relationship between the $\partial \Delta Tr/\partial D$ and the exposure amount in the vicinity of 140° C. is shown in FIG. 29. Here, the $\partial \Delta Tr/\partial D$ indicates the change amount of the film thickness difference ΔTr with respect to the exposed amount D so that with a larger value thereof, the ΔTr changes sensitively with respect to the exposed amount. As shown in FIG. 29, the value of the $\partial \Delta Tr/\partial D$ at the 13.5 mJ/cm$^2$ exposure amount, at which the $\partial \Delta Tr/\partial T$ has the maximal value, was ¼ of the maximum value, and thus the change amount of the film thickness difference ΔTr with respect to the exposure amount change was small.

According to the exposure amount condition, change of the film thickness difference ΔTr can be restrained even when the exposure amount change exists among each shot, and the temperature change at the time of the PEB can be detected sensitively so that the temperature detection in the plane can be enabled with the excellent accuracy.

Although the exposure amount was 13.5 mJ/cm$^2$ in this embodiment, it is not limited thereto. For example, it is preferable to find out the condition by which the temperature change can be detected as the film thickness difference ΔTr change sensitively and highly accurately according to the characteristic of the resist to be used by the method disclosed in this embodiment. Otherwise, it is preferable to use a resist having the above-mentioned characteristic, that is, the characteristic to provide the maximal values (maximum values) of the $\partial \Delta Tr/\partial T$ and the $\partial \Delta Tr/\partial D$ by different exposure amounts.

Although the film thickness difference ΔTr was sought by the CCD detection intensity from the exposed domain in this embodiment, it is not limited thereto. For example, by using the value normalized by the CCD detection intensity from the adjacent unexposed domain, the film thickness difference ΔTr can be calculated further accurately.

Moreover, although the resist film thickness after the bake treatment was measured by the method of observing the zero-order diffracted light by the CCD camera and calculating the resist film thickness from the detected light intensity in this embodiment, the resist film thickness of the exposed portion and the unexposed portion can be measured with a film thickness meter utilizing the wavelength dependency of the reflected light intensity, such as Nanospec 210 produced by Nanometorics Corp. At the time of calculating the resist film thickness, it is preferable to preliminarily find out the optical constant of the resist and the reflection preventing film by spectral ellipsometry, or the like.

Figure 30A:
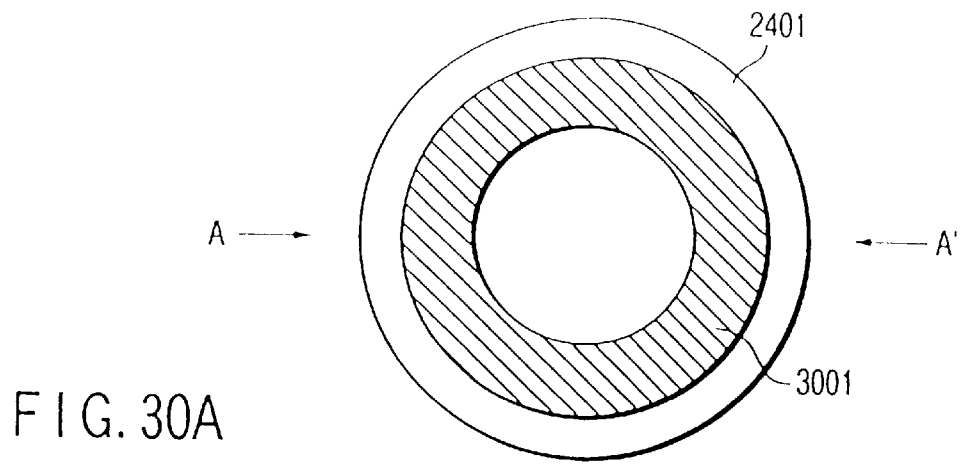
FIG. 30A is a plan view of the rear side of a bake unit different from the bake unit shown in FIGS. 24A and 24B.
Figure 30B:
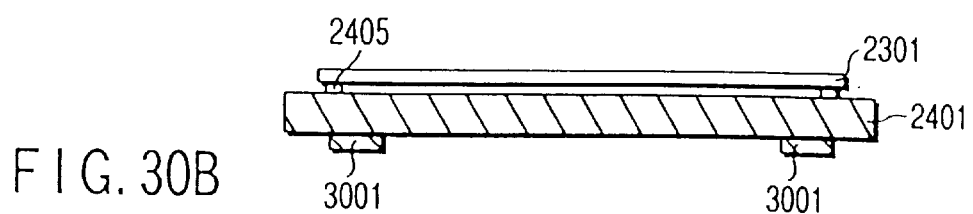
FIG. 30B is a cross-sectional view of the bake unit shown in FIG. 30A, taken on the line A–A'.

Furthermore, although the bake unit comprising the three concentric heaters was used in this embodiment, the number of heaters, and the shape of the heater are not limited thereto. For example, a heat treatment device having a single ring heater 3001 as the heat source as shown in FIGS. 30A and 30B can also be adopted. FIG. 30A is a plan view of the rear side of the bake unit HP3, and FIG. 30B is a cross-sectional view taken on the line A–A' of FIG. 30A. The parts in FIGS. 30A and 30B the same as those in FIGS. 24A and 24B are applied with the same numerals, and explanation is not given herein.

In order to adjust the heating device, the film thickness difference ΔTr at the position corresponding to the heat source can be measured so as to find the temperature from the measured film thickness difference ΔTr for the adjustment. Moreover, the temperature distribution in the plane needs not be sought for adjusting the heating device, but the adjustment can be conducted by finding the temperature at one point.

A method for forming a desired resist pattern, using the treatment system having the bake unit HP3 with the temperature accordingly controlled, will be explained. Since the formation step of the reflection preventing film and the resist film is the same as the optimization of the heater control condition using the resist as the temperature measuring medium explained above, it is not explained herein, and the step after the exposure will be explained.

After projecting and exposing a desired circuit pattern on the wafer by the exposing device with a reduced size, the wafer was returned to the treatment systems 2200 via the interface unit INT, and further, was transported to the bake unit HP3 by the transportation unit CAR for conducting the bake treatment after exposure called PEB. The set temperature of each heater here was optimized by the method already mentioned for allowing the heat treatment with a good uniformity in the wafer plane. The wafer was applied with the PEB treatment with a 140° C., 90 seconds condition by the bake unit HP3.

After cooling the wafer to the vicinity of the room temperature by the cooling unit (not illustrated), an alkaline developing treatment was conducted for 90 seconds by the developing unit DEV. After finishing the developing treatment, it was applied with a rinse treatment, and a spin dry treatment, and was transported to the wafer station.

As a result of measuring the resist size after development in the wafer plane, the uniformity in the plane of the 180 nm line and space pattern, which is one of the circuit patterns, was improved dramatically to 7.2 nm compared with the value of 12.1 nm (3σ) when the resist pattern was formed with the PEB treatment condition without being optimized.

Although the desired resist pattern was formed after preliminarily optimizing the heat treatment condition at the time of the PEB in this embodiment, it is not limited thereto. It is also possible to provide a monitor domain on the same exposing mask as the desired pattern for obtaining information from the monitor domain during the PEB treatment for the feedback to the heating condition consecutively. Moreover, it is also possible to control the heater by the feedback operation, using the change according to time of the resist film thickness difference ΔTr in the exposed domain, that is, at least one value selected from the group consisting of the proportion value (P), the integral value (I), and the differential value (D).

Tenth Embodiment

In this embodiment, a method of adjusting the exposing device and the heat treatment device will be explained. Since the treatment system used in this embodiment shown in FIG. 22 is the same as that used in the ninth embodiment, explanation is not given herein.

The wafer placed on the wafer station WS is transported to the coating unit COT1 by the transportation unit CAR. After spin coating a reflection preventing film on the wafer, it is transported to the bake unit HP1 by the transportation unit CAR. It is applied with a bake treatment with a 190° C., 60 seconds condition so as to form a reflection preventing film having a 60 nm film thickness on the wafer. Then, after coating a positive type chemically amplified resist by the coating unit COT2 after passing through a cooling unit (not illustrated), it was transported to the bake unit HP2 for applying a heat treatment called prebake with a 140° C., 90 seconds condition so as to form a 400 nm resist film on the reflection preventing film. As the resist here, one the same as the ninth embodiment was used. After cooling the wafer to the vicinity of the room temperature by the cooling unit (not illustrated), it was transported to the exposing device (not illustrated) via the interface unit INT.

Figure 31:
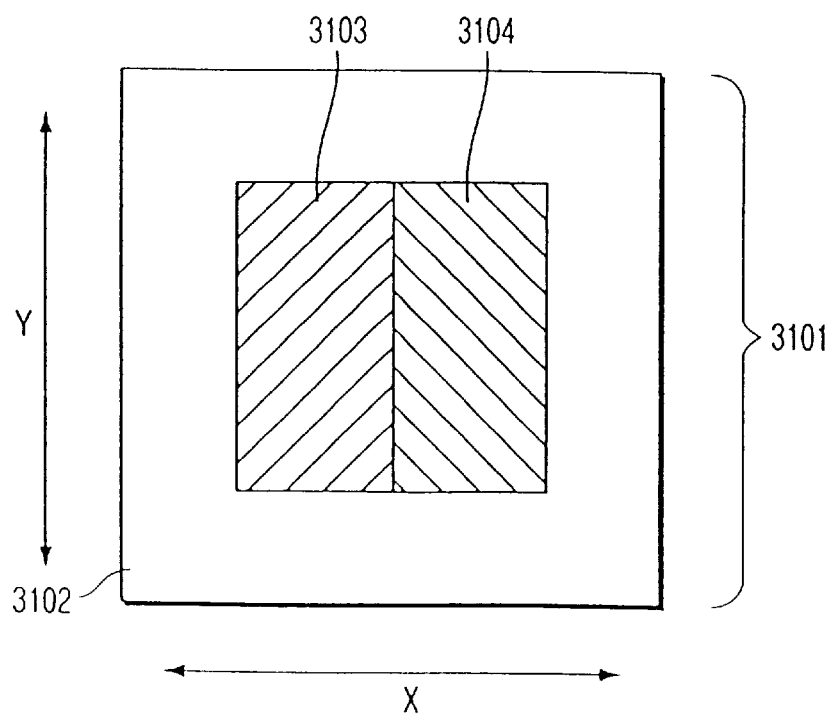
FIG. 31 is a plan view showing the configuration of an exposure mask to be used for the exposure according to a tenth embodiment of the present invention.

The wafer was exposed with a projection exposing mask 3101 shown in FIG. 31. The projection exposing mask 3101 is formed by laminating a translucent film on a transparent substrate 3102, with a domain 3103 and a domain 3104 having different transmissivities. By adjusting the film thickness of the translucent film, each transmissivity in the domain 3103 and the domain 3104 was controlled such that the intensity transmissivity in the domain 3103 is 51.9%, and in the domain 3104 is 23.1%.

Figure 32A:
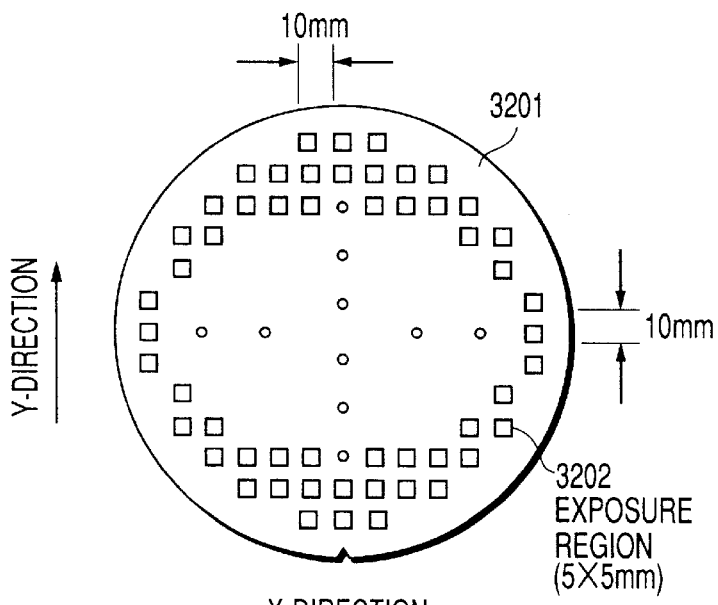
FIG. 32A is a plan view of an exposed wafer.
Figure 32B:
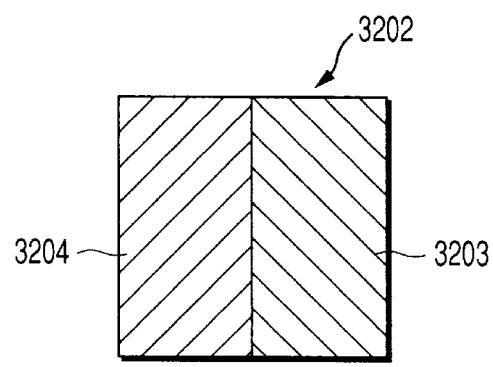
FIG. 32B is an enlarged view of an exposed domain of the wafer shown in FIG. 32A.

The entire surface of the wafer was exposed with a 26.0 mJ/cm$^2$ exposure amount condition. The exposing domain was made to be 5 mm square, with the exposing mask center located as the center, using the blind function of the exposing device. Moreover, as shown in FIG. 32A, the entire surface of the wafer was exposed such that a 5 mm square exposed domain 3202 was formed on the wafer 3201 with a 10 mm step in both x direction and y direction. Since the exposure amount to be directed onto the resist depends on the transmissivity of the exposing mask, it differs in the left side half and the right side half in the shot of the 5 mm square exposing domain 3202, as shown in FIG. 32B. Since the right and left sides are reversed at the time of the reduced projection, the exposure amount of the first exposed part 3203 was 13.5 mJ/cm$^2$, and the exposing amount of the second exposed part 3204 was 6.0 mJ/cm$^2$.

After the exposure, the wafer is returned to the treatment system 2200 via the interface unit INT, and further, is transported to the bake unit HP3 by the transportation unit CAR for conducting the bake treatment after exposure called the PEB. With the bake unit HP3 comprising a divided heater as disclosed in the ninth embodiment, the PEB treatment was conducted with a 140° C., 90 seconds condition. Then, the after cooling the wafer to the vicinity of the room temperature by the cooling unit (not illustrated), it was transported to the wafer station WS.

Then, the wafer was taken out from the treatment system for measuring the film thickness in two exposed portions 3203, 3204 in the 5 mm square and the adjacent unexposed domain so as to calculate: $\Delta Tr_{13.5}$=(film thickness of the unexposed domain)−(film thickness of the first exposed portion 3203), $\Delta Tr_{6.0}$=(film thickness of the unexposed domain)−(film thickness of the second exposed portion 3204) in the wafer plane.

The resist film thickness in the exposed portion and the unexposed domain was sought by observing the zero-order diffracted light with a CCD camera, and calculating the resist film thickness from the detected light intensity as in the ninth embodiment.

By seeking the film thickness differences $\Delta Tr_{13.5}$, $\Delta Tr_{6.0}$ at each (x, y) coordinate, the distribution of the change amount of the resist film thickness ΔTr in the wafer plane can be obtained for the two exposing amount (13.5 mJ/cm$^2$ and 6.0 mJ/cm$^2$).

In general, it is difficult to expose the wafer plane with the completely same exposure amount, and thus, the exposure amount irregularity is generated among shots. Since the film thickness difference ΔTr is a function of the temperature T and the exposure amount D, for detecting the temperature distribution further accurately, it is needed to be separated from the exposing amount change.

Here, the film thickness differences $\Delta Tr_{D1}$ and $\Delta Tr_{D2}$ of the resist to exposing amounts D1 and D2 can be approximated by the following formulae:

$$\Delta Tr_{D1}=F((1+\alpha)\times D1)\{1+\Delta T\times G\times((1+\alpha)\times D1)\}$$

$$\Delta Tr_{D2}=F((1+\alpha)\times D2)\{1+\Delta T\times G\times((1+\alpha)\times D2)\}$$

Figure 33:
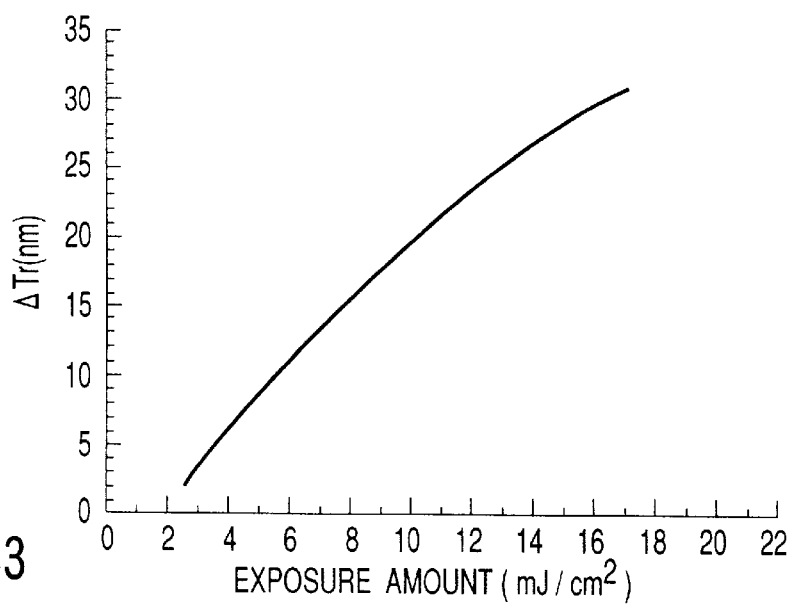
FIG. 33 is a characteristic graph showing the exposure amount dependency of the film thickness difference ΔTr.

F(D) represents the film thickness change amount of the resist when an exposing amount D is provided at a desired treatment temperature (140° C. here). It has a relationship shown in FIG. 33 with respect to the exposing amount D. Moreover, function G(D) represents a rate of change of the film thickness of the resist to a unit treatment temperature. Furthermore, $\alpha$ represents a rate of variation of the exposing amount, and $\Delta T$ represents a value of variation of the treatment temperature in the plane.

Since D1 and D2 are known, by solving the above two equations, $\alpha$ and $\Delta T$ can be calculated. The film thickness difference $\Delta Tr$ at the center position of the wafer was measured to be found that $\Delta Tr_{13.5}$ is 24.4 nm, and $\Delta Tr_{6.0}$ is 12.8 nm. By solving the above two equations, $\alpha=+0.00538$ and $\Delta T=-0.75°$ C. were obtained.

As mentioned above, by finding the film thickness difference $\Delta Tr$ at two different exposing amounts, and calculating $\alpha$ and $\Delta T$ in the wafer plane, respectively, while using the relationship between the $\Delta Tr$ change amount (function G(D)) with respect to the temperature change and the $\Delta Tr$ change amount (function F(D)) with respect to the exposing amount, the temperature distribution at the time of the heat treatment and the exposing amount distribution at the time of exposure, which have been difficult to separate, can be found accurately.

The results accordingly obtained were fed back to the exposing amount condition of each shot of the exposing device and the heat treatment temperature condition at the time of the PEB for forming a desired circuit pattern.

As a further concrete feedback method, for example, when the $\alpha$ in a certain domain is plus, the exposing amount at the position corresponding to the domain can be set smaller according to the value of $\alpha$, on the other hand, when it is minus, the exposing amount can be set larger according to ($-\alpha$). Moreover, when the $\Delta T$ in a certain domain is plus, the heat treatment temperature at the position corresponding to the domain can be set smaller according to the value of $\Delta T$, on the other hand, when it is minus, the treatment temperature can be set larger according to ($-\Delta T$).

As a result of forming a desired resist pattern accordingly, the uniformity in the plane of the 150 nm line and space pattern, which is one of the patterns, was improved dramatically to 5.2 nm compared with the value of 14.1 nm (3$\sigma$) when the resist pattern was formed with the conventional condition without conducting the feedback.

Although the two exposure amounts were 6.0 and 13.5 mJ/cm$^2$ in this embodiment, it is not limited thereto. For example, it is preferable to find out the exposing amount condition according to the characteristic of the resist to be used by the method disclosed in this embodiment.

Moreover, although the resist film thickness after the bake treatment was measured by the method of observing the zero-order diffracted light by the CCD camera and calculating the resist film thickness from the detected light intensity in this embodiment, the resist film thickness of the exposed portion and the unexposed portion can be measured with a film thickness meter utilizing the wavelength dependency of the reflected light intensity, such as Nanospec 210 produced by Nanometorics Corp. At the time of calculating the resist film thickness, it is preferable to preliminarily find out the optical constant of the resist and the reflection preventing film by spectral ellipsometry, or the like.

Although the film thickness difference $\Delta Tr$ was sought by the CCD detection intensity from the exposed domain in this embodiment, it is not limited thereto. For example, by using the value normalized by the CCD detection intensity from the adjacent unexposed domain, the film thickness difference $\Delta Tr$ can be calculated further accurately.

Although the desired resist pattern was formed after preliminarily optimizing the heat treatment condition at the time of the PEB in this embodiment, it is not limited thereto. It is also possible to provide a monitor domain on the same exposing mask as the desired pattern for obtaining information from the monitor domain during the PEB treatment for the feedback to the heating condition consecutively. Moreover, it is also possible to control th e heater by the feedback operation, using the change according to time of the resist film thickness difference $\Delta Tr$ in the exposed domain, that is, at least one value selected from the group consisting of the proportion value (P), the integral value (I), and the differential value (D).

The present invention is not limited to the embodiments described above. Although a heat plate such as a heater was used as a means for heating a substrate to be treated, such as a semiconductor wafer, or the like, in the embodiments, it is not limited thereto, but anything can be used as long as it can heat the substrate homogeneously, such as heating by a lamp. Moreover, the wavelength of the light to be directed to the substrate to be treated is not limited to the one described in the embodiments, but a visual light or an ultraviolet ray having a wavelength shorter than that of an infrared r ay c an be used.

Furthermore, although the embodiments are adopted in heating before or after exposure, they can also be adopted in the heat treatment of various kinds of substrates to be treated as long as the film thickness and the optical constant, or the like change according to the heating amount so as to generate the reflected light in tensity change. Moreover, the present invention can be modified in various ways without departing from the gist thereof.

As heretofore mentioned in detail, according to the present invention, by utilizing the change by the heating temperature and the heating amount of the 0th-order light intensity from the monitor pattern portion being heated and the resist portion, and monitoring the 0th-order light intensity, the heating amount of the wafer being heated can be detected accurately. Therefore, by the feedback to the heating device so as to keep a constant temperature, the temperature of the substrate to be treated can be maintained constantly. Moreover, by finishing heating when the heating amount reaches a desired value, the total heating amount can be controlled, and thus the heating amount per substrate to be treated can be constant. From the above-mentioned, since the heating condition per substrate to be treated can be constant, the size irregularity among substrates to be treated can be reduced. Furthermore, by providing a plurality of monitor heads, the heating uniformity in the plane of the substrate to be treated can be improved so that the size irregularity in the plane of the substrate to be treated can be reduced. Accordingly, the reliability and the yield of the devices can be improved dramatically.

Moreover, the heating temperature at the exposed domain can be sought from the relationship between the film thickness difference $\Delta Tr$ of the exposed domain and the adjacent unexposed domain in the photosensitive resin film after exposure, and the preliminarily sought film thickness difference and the treatment temperature so that the heating device can be adjusted easily.

Furthermore, by finding the film thickness difference $\Delta Tr$ for two different exposing amounts, and calculating a and $\Delta T$ in the wafer plane, respectively, while using the preliminarily sought relationship between the film thickness difference change with respect to the temperature change and the film thickness difference change with respect to the exposing amount change, the temperature distribution at the time of the heat treatment and the exposing amount distribution at the time of exposure, which have been difficult to separate, can be found accurately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for evaluating a heating apparatus comprising:
    a step for forming a photosensitive resin film on a substrate;
    a step for performing exposure on a plurality of exposure regions on the photosensitive resin film in an irradiation amount Dopt;
    a step for performing heat treatment on the photosensitive resin film to measure the film thickness of the photosensitive resin film at an unexposed domain adjacent to each exposure region, thereby obtaining a film thickness difference $\Delta Tr$ between the exposed domain and the unexposed domain; and
    a step for obtaining a heating temperature distribution from the film thickness difference $\Delta Tr$ in each obtained exposure region and a relationship between a film thickness difference $\Delta Tr$ which has been obtained in advance and heating treating temperature.

2. A method for evaluating a heating apparatus according to claim 1, wherein the irradiation amount Dopt is a value where change amount $\partial \Delta Tr/\partial T$ to temperature of the film thickness difference $\Delta Tr$ becomes the maximal value or the maximum value.

3. A method for evaluating a heating apparatus/an exposing apparatus, comprising:
    a step for forming a photosensitive resin film on a substrate;
    a step for applying irradiation amounts Dopt1 and Dopt2 different from each other to a first exposure portion and a second exposure portion adjacent to each other on a plurality of exposure regions on the photosensitive resin film by one time irradiation;
    a step for performing heat treatment on the photosensitive resin film to measure the film thickness of the photosensitive resin film at the first and second exposure portions on each exposure region and an unexposed domain adjacent thereto, thereby obtaining a film thickness difference $\Delta Tr1$ between the first exposure portion in each exposure region and the unexposed domain and a film thickness difference $\Delta Tr2$ between the second exposure portion and the unexposed domain; and
    a step for obtaining heating temperature during the heat treatment and a distribution of irradiation amount applied by one time irradiation from the film thickness differences $\Delta Tr1$ and $\Delta Tr2$ in each measured exposure region and a relationship between change in film thickness difference to change of exposing amount which has been obtained in advance and change in film thickness difference to change in treating temperature.

4. A pattern forming method where pattern forming is performed, wherein after adjusting a heating apparatus the method comprises:

a step for forming a photosensitive resin film on a substrate;
    a step for performing exposure on an exposure region on the photosensitive resin film in an irradiation amount Dopt;
    a step for performing heat treatment on the photosensitive resin film by a heating apparatus to measure the film thickness of the photosensitive resin film at an unexposed domain adjacent to the exposure region, thereby measuring a film thickness difference $\Delta Tr$ between the exposure region and the unexposed domain;
    a step for obtaining heating temperature during the heat treatment from the film thickness difference $\Delta Tr$ in the measured exposure region and a relationship between a film thickness difference $\Delta Tr$ which has been obtained in advance and heating treating temperature; and
    a step for adjusting the heating apparatus from the obtained heating temperature, and the method comprising: a step for forming a resist film on a substrate to be treated;
    a step for transferring a pattern formed on a projection substrate onto the resist film;
    a step for performing heat treatment on the resist film by the heating apparatus; and
    a step for applying developing liquid to the resist film to selectively remove a portion of the resist film.

5. A pattern forming method according to claim 4, wherein the irradiation amount Dopt is a value where change amount $\partial \Delta Tr/\partial T$ to temperature of the film thickness difference $\Delta Tr$ becomes the maximal value or the maximum value.

6. A pattern forming method including a step for forming a resist film on a substrate to be treated;
    a step for performing exposure in an exposing amount Dopt to transfer a pattern formed on a projection substrate onto the resist film; and
    a step for applying developing liquid to the resist film to selectively remove a portion of the resist film,
    wherein, the heat treatment comprises the steps of,
    measuring the film thickness of the resist film at an unexposed domain adjacent to the exposure region to measure a film thickness difference $\Delta Tr$ between the exposure region and the unexposed domain;
    obtaining heating temperature from the film thickness difference $\Delta Tr$ in the measured exposure region and a relationship between a film thickness difference $\Delta Tr$ which has been obtained in advance and heating treating temperature; and
    heating the resist film while the control conditions of the heating apparatus is being adjusted in response to the obtained the heating temperature.

7. A pattern forming method according to claim 6, wherein the irradiation amount Dopt is a value where change amount $\partial \Delta Tr/\partial T$ to temperature of the film thickness difference $\Delta Tr$ becomes the maximal value or the maximum value.

8. A pattern forming method wherein after adjusting a heating apparatus/exposing apparatus the method comprises:
    a step for forming a photosensitive resin film on a substrate;
    a step for applying irradiation amounts Dopt1 and Dopt2 different from each other to a first exposure portion and a second exposure portion adjacent to each other on an exposure region of the photosensitive resin film with one time irradiation by an exposing apparatus;

a step for performing heat treatment on the photosensitive resin film by a heating apparatus to measure the film thickness of the photosensitive resin film at the first and second exposure portions in the exposure region and the unexposed domain adjacent to the exposure region, thereby measuring a film thickness difference $\Delta Tr1$ between the first exposure portion and the unexposed domain and a film thickness difference $\Delta Tr2$ between the second exposure portion and the unexposed domain;

a step for obtaining heating temperature during the heat treatment and actual irradiation amounts which have been irradiated on the first and second exposure portions from the film thickness differences $\Delta Tr1$ and $\Delta Tr2$ in the measured exposure region and a relationship between change in film thickness difference to change in exposing amount which has been obtained in advance and change in film thickness difference to change to the heating treating temperature; and a step for adjusting the heating apparatus/exposing apparatus from the obtained heating temperature and exposing amount, wherein the method comprises a step for forming a resist film on a substrate to be treated;

a step for transferring a pattern formed on the exposure projection substrate onto the resist film;

a step for performing heat treatment on the resist film by the heating apparatus; and a step for applying developing liquid to the resist film to selectively remove a portion of the resist film.

9. A pattern forming method comprising a step for forming a resist film on a substrate to be treated;

a step for performing exposure on the resist film by an exposing apparatus to transfer a pattern formed on a projection substrate onto the resist film;

a step for performing heat treatment on the resist film by a heating apparatus; and a step for applying developing liquid to the resist film to selectively remove a portion of the resist film, wherein the transferring step comprises applying irradiation amounts $Dopt1$ and $Dopt2$ different from each other to a first exposure portion and a second exposure portion adjacent to each other on a monitor region of the resist film, and the heat treatment step comprises measuring the film thickness of the resist film at the first and second exposure portions and an unexposed domain adjacent thereto on the monitor region to measure a film thickness difference $\Delta Tr1$ between the first exposure portion and the unexposed domain on the monitor region and a film thickness difference $\Delta Tr2$ between the second exposure portion and the unexposed domain;

obtaining heating temperature on the monitor region from the film thickness differences $\Delta Tr1$ and $\Delta Tr2$ on the measured monitor region and a relationship between change in film thickness difference to change in exposing amount which has been obtained in advance and change in film thickness difference to change in treating temperature; and heating the resist film while the control conditions of the heating apparatus is being adjusted in response to the obtained heating temperature.

* * * * *